(12) United States Patent
Kawabe et al.

(10) Patent No.: US 6,846,610 B2
(45) Date of Patent: Jan. 25, 2005

(54) POSITIVE PHOTOSENSITIVE RESIN COMPOSITION

(75) Inventors: Yasumasa Kawabe, Shizuoka (JP); Kenichiro Sato, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/315,182

(22) Filed: Dec. 10, 2002

(65) Prior Publication Data

US 2003/0138727 A1 Jul. 24, 2003

Related U.S. Application Data

(62) Division of application No. 09/295,329, filed on Apr. 21, 1999.

(30) Foreign Application Priority Data

| Apr. 22, 1998 | (JP) | ............................................ 10-112219 |
| Aug. 14, 1998 | (JP) | ............................................ 10-229792 |
| Aug. 14, 1998 | (JP) | ............................................ 10-229793 |
| Sep. 3, 1998 | (JP) | ............................................ 10-250050 |

(51) Int. Cl.$^7$ .............................................. G03C 1/76
(52) U.S. Cl. ............................. 430/270.1; 430/281.1; 430/286.1; 430/905; 430/907; 430/910
(58) Field of Search ........................... 430/270.1, 286.1, 430/281.1, 905, 910, 907

(56) References Cited

U.S. PATENT DOCUMENTS

| 5,665,518 | A | 9/1997 | Maeda et al. |
| 5,691,111 | A | 11/1997 | Iwasa et al. |
| 5,707,776 | A | 1/1998 | Kawabe et al. |
| 5,744,281 | A | 4/1998 | Niki et al. |
| 5,756,850 | A | 5/1998 | Iwasa et al. |
| 5,770,346 | A | 6/1998 | Iwasa et al. |
| 5,824,451 | A | 10/1998 | Aoai et al. |
| 5,939,234 | A | 8/1999 | Yamanaka et al. |
| 5,945,250 | A | 8/1999 | Aoai et al. |
| 6,060,213 | A | 5/2000 | Kodama |
| 6,235,445 | B1 * | 5/2001 | Nakamura et al. .......... 430/200 |
| 6,265,135 | B1 * | 7/2001 | Kodama et al. ......... 430/286.1 |

FOREIGN PATENT DOCUMENTS

| EP | 0 789 278 A2 | 8/1997 |
| EP | 0 878 738 A2 | 11/1998 |

* cited by examiner

*Primary Examiner*—Yvette C. Thornton
(74) *Attorney, Agent, or Firm*—Sughrue Mion, PLLC

(57) ABSTRACT

Provided is a positive photosensitive resin composition comprising (A) a polymer which has alicyclic hydrocarbon skeleton and decomposes under the action of an acid to be rendered soluble in alkali, (B) a compound which generates an acid upon irradiation with actinic rays, (C) a nitrogen-containing basic compound, (D) at least one of a fluorine-containing surfactant and a silicon-containing surfactant and (E) a solvent. The composition can exhibit better characteristics when the solvent (E) is a combination of specified solvents.

21 Claims, No Drawings

POSITIVE PHOTOSENSITIVE RESIN COMPOSITION

This is a divisional of application Ser No. 09/295,329 filed Apr. 21, 1999; the disclosure of which is incorporated herein by reference.

FIELD OF THE INVENTION

The present invention relates to a positive photosensitive resin composition used in a production process of semiconductor devices, such as IC, production of circuit substrates for liquid crystal, thermal head and the like, and other photo-fabrication processes. To mention in detail, the invention is concerned with a positive photosensitive resin composition used appropriately for producing semiconductor elements by means of micro-lithography utilizing energy beams of short wavelengths, such as far ultraviolet rays, X-rays and electron beams. In particular, the invention relates to a positive photosensitive resin composition used advantageously for producing semiconductor elements by means of micro-lithography utilizing ArF excimer laser.

BACKGROUND OF THE INVENTION

In recent years the research and development for raising the integration degree of semiconductor integrated circuits has made rapid progress and, with the practical use of LSI and VLSI, the minimum pattern width of integrated circuits has reached the level of a sub-half micron. Further, the patterns are being fined.

Under these circumstances, requirements for photolithographic technology applied to fine pattern formation have become severer and severer. As one of means to aim at fining patterns, it is known to select light of shorter wavelengths as the exposure light for forming resist patterns.

For instance, in the production of DRAM having an integration degree up to 64 Mega-bit, i-ray (365 nm) of a high-pressure mercury lamp has so far been used as light source. In the mass production of 256 Mega-bit DRAM, KrF excimer laser (248 nm) has been put to practical use as a light source instead of i-ray. Further, light sources of shorter wavelengths have been investigated for the purpose of producing DRAM with an integration degree of 1 Giga-bit or above, and thereby the utilization of ArF excimer laser (193 nm), $F_2$ excimer laser (157 nm), X-rays and electron beams has been considered effective (Takumi Ueno et al., *Short-wavelength Photoresist Materials— Micro-lithography for ULSI*, Bunshin Shuppan (1988)).

In particular, ArF excimer laser is evaluated as the light source for exposure arts in the next generation, and so it is desired to develop resist materials which are suitable for exposure to ArF excimer laser and can ensure high sensitivity, high resolution and excellent-dry etching resistance.

As conventional resist materials for exposure to i-ray and KrF excimer laser, the resist materials containing aromatic polymers have widely been used with the intention of ensuring high dry etching resistance. For instance, there are known novolak resin resist and chemically amplified resist of polyvinylphenol type. However, the aromatic rings introduced for the purpose of conferring dry etching resistance on resist hardly transmit light in the wavelength region of ArF excimer laser, so that it is difficult for the light to arrive at the bottom of resist film. Therefore, the conventional resist materials cannot form patterns having satisfactory profile.

As a solution to a problem concerning the transparency of resist, the use of aromatic ring-free aliphatic polymers, such as polymethyl methacrylate, is known to be acceptable (*J. Vac. Sci. Technol.*, B9, 3357 (1991)). However, such polymers are not practicable because sufficient dry etching resistance can hardly be expected therefrom. The greatest problem which confronts the development of resist materials for exposure to ArF excimer laser is to ensure both improved transparency and high dry etching resistance in the resist film.

So it was reported in *Proc. SPIE*, 1672, 66 (1992) that the resist materials containing alicyclic hydrocarbon groups instead of aromatic groups showed dry etching resistance similar to those containing aromatic groups and had weak absorption at 193 nm. As a result, the utilization of such polymers has energetically been studied in recent years.

Originally, the application of polymers containing alicyclic hydrocarbon groups to resist materials has been attempted from of old. For instance, the norbornene polymers are disclosed in JP-A-60-195542, JP-A-1-217453 and JP-A-2-59751 (the term "JP-A" as used herein means an "unexamined published Japanese patent application"), and various alkali-soluble resins having cyclic aliphatic hydrocarbon skeletones and maleic anhydride units are disclosed in JP-A-2-146045.

Further, the copolymers of norbornene and acrylates protected by acid decomposable groups are disclosed in JP-A-5-80515, the copolymers having adamantane skeletons in side chains are disclosed in JP-A-4-39665, JP-A-5-265212, JP-A-5-80515 and JP-A-7-234511, the polymers having side chains to which are attached $C_7$-$C_{12}$ aliphatic cyclic hydrocarbon groups containing bridged cyclic hydrocarbon groups, such as tricyclo[5,2,1,02,6]decanedimethylene group, tricyclo-[5,2,1,02,6]decanediyl group, norbornanediyl group, norbornanedimethyl group and adamantanediyl group, are disclosed in JP-A-7-252324 and JP-A-9-221526, and the polymers having side chains to which are attached tricyclodecanyl groups, dicylopentenyl groups, docyclopentenyloxyethyl groups, norbornyl groups or cyclohexyl groups are disclosed in JP-A-7-199467.

Furthermore, the polymers having cyclohexane and isobornyl skeletons in their main chains are disclosed in JP-A-9-325498, the polymers having main chains wherein are introduced various cyclic olefins, e.g., dicycloolefin, are disclosed in JP-A-9-230595, JP-A-9-244247, JP-A-10-10739, WO 97-33198, and European Patents 794,458 and 789,278. In addition, JP-A-8-82925 and JP-A-9-230597 disclose that the compounds having menthyl or menthyl derivative groups are preferable to the compounds having other terpenoid skeletons.

Separately from the aforementioned problem concerning resist properties, the generation of defects (voids) attributable to lithographic processes constitutes a major factor in lowering a yield, which has been a recent big problem to be tackled.

The development defects, for instance, are said to be attributable to air bubbles generated at the time of serving a developer and micro bubbles due to the gas dissolved in a developer (Hirano et al., The 42th Applied Physical Society Symposium 27p-ZW-9 (1996)). With the increase in diameter of wafers and amount of a developer jetted out, the air bubble-control measure becomes a matter of greater importance. As measures to prevent air bubbles, it has been attempted to improve an apparatus so as to softly jet out a developer (See a book, entitled "Contamination Control Techniques for ULSI Production", p. 41, published by Science Forum Co. (1992)) and to reduce air bubbles by addition of a degassing mechanism for dissolved gas.

However, these measures are not successful in reducing the defects to a satisfactory level.

As other measures to reduce development defects, the addition of a nonionic surfactant to a developer has been devised for improving the wettability of a developer to promote the release of air bubbles, and the affinity improvement has been attempted by finding out the most appropriate species and addition amount for the surfactant used in novolak resist (Hakushima et al., The 42th Applied Physical Society Symposium 27p-ZW-7 (1996)).

However, these measures are insufficient for the reduction of development defects in nonaromatic polymer-utilized ArF laser resist of chemical amplification type; on the contrary, they sometimes have adverse effect thereon. Therefore, no guidelines on what measure to take for reduction of development defects have been drawn up yet. In addition, raising the affinity of resist with the intention of reducing development defects tends to cause deterioration in residual film rate and profile, so that it is very difficult to ensure both reduced development defects and high quality of resist patterns.

Further, as reported by, e.g., *Proc. SPIE*, 1672, 46 (1992), *Proc. SPIE*, 2438, 551 (1995), *Proc. SPIE*, 2438, 563 (1995), *Proc. SPIE*, 1925, 14 (1993), *J. Photopolym. Sci. Tech.*, vol. 8, No. 4, 535 (1995), *J. Photopolym. Sci. Tech.*, vol. 5, No. 1, 207 (1992), *J. Photopolym. Sci. Tech.*, vol. 8, No. 4, 561 (1995), and *Jpn. J. Appl. Phys.*, 33, 7023 (1994), conventional aromatic polymer-utilized KrF laser positive resist materials of chemical amplification type have a problem of suffering diffusion of the acid produced therein and deactivation of the acid in the surface part of the resist by basic impurities in the atmosphere as the standing period from exposure to heat treatment (PEB) is prolonged, thereby changing the sensitivity and the profile and line width of the resist pattern obtained by development.

As for the known means to solve such a problem, the arts of adding amines to aromatic polymer-utilized chemically amplified resist materials are disclosed in, e.g., JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-C-7-508840 (the term "JP-C" as used herein means a "PCT application published in Japanese"), U.S. Pat. No. 5,525,453, U.S. Pat. No. 5,629,134 and U.S. Pat. No. 5,667,938.

Although the addition of those amines to chemically amplified ArF laser resist materials using nonaromatic polymers having cyclic aliphatic hydrocarbon skeletons, in analogy with those using aromatic polymers, surely has an effect on the sensitivity change and the changes in the profile and line width of the resist pattern obtained by development, it causes a serious deterioration in development defects. Therefore, it has been desired to take some measure to deal with this situation.

Furthermore, it has been devised to heighten resolution by the addition of low molecular weight dissolution inhibitors.

For instance, JP-A-8-15865 discloses the t-butyl ester of androstane as a dissolution inhibitor, and JP-A-9-265177 discloses low molecular weight dissolution inhibitors wherein an acid decomposable group is attached to a norbornyl, adamantyl, decanyl or cyclohexyl group. In addition, it is reported in *Proc. SPIE*, 3049, 84 (1997) that the use of t-butyl lithocolate oligomers as dissolution inhibitor can improve the adhesiveness and the contrast.

On the other hand, the coating solvents which have generally been used for conventional positive photoresist materials of naphthoquinonediazide/novolak resin type are glycol ethers such as 2-methoxyethanol and 2-ethoxyethanol, and acetates thereof such as ethylene glycol monomethyl ether acetate and ethylene glycol monoethyl ether acetate.

However, the fear that the solvents containing these glycol ether derivatives would have bad influence upon the generative function of mice was pointed out in 1979, and since then the tests on animals have been repeated mainly in western countries. As a result, it was ascertained that those solvents had biological toxicity such as generative functional disorder, and reported that those solvents constitute a potential biological threat to safety of workers (NIOH Current Intelligence Buletin, vol. 39, No. 5 (1983)). Further, the Environmental Protection Agency (EPA) of America advised to strengthen the regulation in 1984, and the movement to strengthen the regulation has been spread.

Under these circumstances, most of photoresist makers wait for the development of photoresist products suitable for low-toxicity solvents free of ethylene glycol ethers.

With respect to the low-toxicity solvents as substitutes for ethylene glycol ethers, there are known the monooxycarboxylates such as ethyl lactate, methyl 3-methoxypropionate, methyl 3-ethoxypropionate, ethyl 3-ethoxypropionate (JP-B-3-22619, U.S. Pat. No. 5,238,774, European Patent 211, 667) and propylene glycol monomethyl ether acetate (JP-B-3-1659 and U.S. Pat. No. 619,468). The term "JP-B" as used therein means an "examined Japanese patent publication". Besides these solvents, it was proposed to use cyclopentanone N-hexanol, diethylene glycol dimethyl ether (*SEMICONDUCTOR INTERNATIONAL*, Vol.4, pp. 132–133 (1988)), 2-heptanone (*NIKKEI MATERIALS & TECHNOLOGY*, Vol. 12, pp. 83–89 (1993)) and methyl pyruvate (JP-A-63-220139, JP-A-4-36752 and U.S. Pat. No. 5,100,758) as solvents for the positive photoresist compositions of naphthoquinonediazide/novolak resin type.

Similarly, the combination of the above-recited methyl 3-methoxypropionate and ethyl 3-ethoxypropionate (JP-A-6-11836) and the combination of the above-recited ethyl lactate and ethyl 3-ethoxypropionate (JP-A-6-308734) are disclosed as the solvents for i-ray or KrF laser resist compositions and chemically amplified positive resist compositions.

As mentioned above, many substitute solvents have been proposed, but the toxicity tests (tests of chronic toxicity, generative toxicity, malformation probability, mutation probability, cancer probability and life's fate) require a long time, and so not all the substitute solvents have proved to be safe.

After all, the toxicity of ethylene glycol monoethyl ether acetate is supposed to be attributed to the toxicity (malformation probability) of ethoxyacetic acid which is produced from 2-ethoxyethanol released upon the decomposition of the foregoing glycol ether acetate by metabolism in living things.

The substitute solvents, e.g., ethyl lactate is supposed to be safe since it is decomposed into lactic acid and ethanol by metabolism in living things, and permitted as a food additive. In analogy with ethyl lactate, ethyl-3-ethoxypropionate is supposed to be highly safe, because it is converted successively into 3-ethoxypropionic acid, ethylmalonic acid and malonic acid by metabolism in living things to produce no alkoxyacetic acid. Similarly, propylene glycol monomethyl ether acetate is reduced to propylene glycol without producing an alkoxyacetic acid, and so the toxicity thereof is ascertained to be much lower than that of the corresponding ethylene glycol.

As mentioned above, the first requirement for photoresist solvents is low toxicity.

The second important requirement for photoresist solvents is to ensure satisfactory coating characteristics in the resist compositions.

With the recent elevation of integration degree in LSI, the diameter of wafers has gotten greater. The greater the wafer diameter, the harder it becomes to ensure spin coating uniformity all over the wafer and avoid leaving uncoated part on the wafer to result in a decrease of industrial value.

For the purpose of improving the coating characteristics of positive photoresist compositions of naphthoquinonediazide/novolak resin type, the addition of fluorine-containing surfactants to known solvents for resist compositions, such as ethylene glycol monoethyl ether, ethylene glycol monoethyl ether acetate, ethylene glycol monomethyl ether, ethylene glycol monomethyl ether acetate, N,N-dimethylformamide, dioxane, cyclohexanone, cyclopentanone, γ-butyrolactone, ethyl lactate and methyl lactate, is disclosed in JP-A-58-105143, JP-A-58-203434 and JP-A-62-36657, and the combinations of cyclopentanone and cyclohexane with $C_5$ to $C_{12}$ aliphatic alcohols are disclosed in U.S. Pat. No. 4,526,856 and JP-A-59-231534.

Further, JP-A-60-24545 discloses that the striation (coating marks made when the resist composition is coated on a substrate) is improved by the combined use of a solvent having a boiling point of 60–170° C. and a solvent having a boiling point of 180–350° C. The generation of striation is attributable to natural convection caused in a liquid film by a temperature difference arising between the surface and the inner part of the liquid film upon rapid vaporization of the solvent. The art of preventing the striation by the addition of surfactants or the use of mixed solvents as mentioned above is being established.

Even if the striation can be prevented by the foregoing arts, it frequently happens that the uniformity of the coating in the diameter direction of a substrate (unevenness of film thickness) develops problems. For instance, it was pointed out that, when the resist composition using ethyl lactate as a solvent is coated, the resist film thickness varies widely, compared with the case of using ethylene glycol monoethyl ether acetate as the resist solvent (*NIKKEI MATERIALS & TECHNOLOGY*, Vol. 12, p. 87 (1993)).

It was reported (in Monthly Semiconductor World, Vol. 1, pp. 125–128 (1991)) that the aforementioned coating characteristics of resist compositions suitable for exposure to i-ray or KrF laser had correlations with physical properties of the solvent used therein, including the evaporation speed, the latent heat upon evaporation and the viscosity. For the purpose of solving this problem, many ideas have been come up with. For instance, ethyl lactate is mixed with ethyl 3-ethoxypropionate (JP-A-3-504422, U.S. Pat. No. 5,063,138, European Patent 442,952 and WO 90/05325), it is mixed with isoamyl acetate or n-amyl acetate (U.S. Pat. No. 5,336,583, European Patent 510,670 and JP-A-5-34918), or it is mixed with anisole and amyl acetate (U.S. Pat. No. 5,128,230).

The overall uniformity requirement for a chemically amplified positive resist composition coated on a wafer is as severe as or severer than that for the aforementioned naphthoquinonediazide/novolak resin type of positive resist composition coated on a wafer. This is because the chemically amplified positive resist compositions coated on wafers having great diameters (at least 6 inches) are used for the semiconductor production in most cases.

These coating characteristics can be improved to a certain extent by improvement of the coating apparatus, more specifically by optimizing the atmosphere temperature upon coating, the substrate temperature, the temperature of resist to be coated, the ventilating condition and so on. However, it is most desirable to ensure uniformity for the resist coating, irrespective of those conditions of the apparatus.

Separately from the foregoing problem, another problem develops in some cases. For instance, certain chemically amplified positive resist compositions separate out fine particles, which cannot be perceived by visual observation, on standing after filtration with a micro-filter, and further come to liberate precipitates when they are stored for a long time.

In the formation of a resist pattern on a wafer by the use of the resist composition containing such fine particles, it occurs that the fine particles are left on the areas to remove the resist by development, resulting in the lowering of resolution.

These fine particles in a chemically amplified positive resist composition arise mainly from a photo-acid generator, an acid-decomposable dissolution inhibitor or/and an alkali-soluble resin containing acid-decomposable groups.

The mixing with a high boiling point solvent, such as N-methyl-2-pyrrolidone, dimethyl sulfoxide or dimethylformamide, with the intention of improving the storage stability is certainly instrumental in effecting such improvement, but causes deterioration in resist characteristics, including resolution, adhesiveness and heat resistance.

Therefore, the third requirement for positive photoresist solvents is to ensure satisfactory storage stability in the resist compositions, thereby avoiding precipitation of constituents of the photoresist upon storage.

Further, the decomposition of a photo-acid generator and an acid-decomposable dissolution inhibitor during storage causes a change in the photoresist sensitivity, and brings a danger of breaking a container of the photoresist (a glass vial) due to the inner pressure. Therefore, suitable photoresist solvents are solvents incapable of inducing the decomposition of photo-acid generators and acid-decomposable dissolution inhibitors.

The other requirements for photoresist solvents are low hygroscipicity and, as mentioned in *Monthly Semiconductor World*, Vol. 1, pp. 135–128 (1991), no deteriorative action on resist characteristics (e.g., sensitivity, resolution, profile, scum, adhesiveness, heat resistance). For example, as described in JP-A-5-173329, ethyl lactate tends to absorb moisture during the preparation and the coating of a photoresist composition. The photoresist which has absorbed moisture suffers deterioration in various resist characteristics.

In addition, it is known that, when a lot of resist solvent remains after baking, the resist pattern tends to undergo thermal deformation (namely, the photoresist tends to suffer deterioration in heat resistance).

Further, it is known that, when novolak resin is used as a binder, the absorption in the deep UV region (around 248 nm) depends greatly on the species of a resist solvent used (*S.P.I.E.*, vol. 1262, pp. 180–187 (1990)). Therefore, the desirable resist solvents are solvents having slight absorption in the deep UV region. In the chemically amplified positive resist compositions, on the other hand, it is known that the solvent remaining in the resist film produces a great effect upon the diffusion of acids (as described, e.g., in *J. Vac. Sci. Technol. B*, Vol. 9, No. 2, pp. 278–289 (1991)). The acid diffusion causes deterioration in the resolution, the effect of a delay in the post exposure bake (PEB) (the undesirable phenomenon induced in resist pattern shape and line width by the extension of standing period from the exposure to the PEB) and so on. Although it's only natural that the diffusiveness of acids depends on the species of compounds as constituents of the photoresist, such as a photo-acid generator and an acid-decomposable dissolution inhibitor, the acid diffusion depends greatly on the species of a resist solvent used. Accordingly, properly selecting a resist solvent is especially important for chemically amplified resist compositions.

The chemically amplified resist using a polymer having alicyclic hydrocarbon skeletons is exceedingly subject to the aforementioned development defects, compared with the conventional aromatic rings-containing novolak resin resist and polyhydroxystyrene resist. As conceivable reasons therefor, the hydrophobic property of the polymer used and the uneven permeation of a developer into the resist film are adduced. Therefore, it is also important to properly select a resist solvent capable of avoiding the development defects. However, no reports setting forth guidelines for making a proper selection of resist solvents have been presented so far.

SUMMARY OF THE INVENTION

One object of the present invention is to provide a positive photosensitive resin composition which can have a high residual film rate, provide excellent resist profile and surmount the problem of development defects when the exposure light source used is deep ultraviolet rays, particularly ArF excimer laser beams.

Another object of the present invention is to provide a positive photosensitive resin composition which can exhibit excellent image formation characteristics, including a high residual film rate, satisfactory resist profile, high resolution, high sensitivity and high developability, and does not cause the problem of development defects when deep ultraviolet rays, particularly ArF excimer laser beams, are used as exposure light source.

Further object of the present invention is provide a chemically amplified resist composition comprising a polymer having alicyclic hydrocarbon skeletons, which is useful for the lithography utilizing deep ultraviolet rays, particularly ArF excimer laser beams, and can function as a positive photosensitive resin composition having excellent resist characteristics, satisfactory coating properties, high storage stability in a dissolved condition, high safety and no problem with development defects.

As a result of our intensive studies of ingredients to constitute a chemically amplified positive resist composition, it has been found that the aforementioned objects can be attained by combining a polymer containing alicyclic hydrocarbon skeletons in its constitutional repeating units, a photo-acid generator, a nitrogen-containing basic compound, and at least one of a fluorine-containing surfactant and a silicon-containing surfactant, thereby achieving the first composition according to the present invention.

More specifically, the following (1) to (8) are embodiments of the present first composition, and thereby the aforementioned objects are attained.

(1) A positive photosensitive resin composition comprising:
(A) a polymer which has alicyclic hydrocarbon skeletons and decomposes under the action of an acid to be rendered soluble in alkali,
(B) a compound which generates an acid upon irradiation with actinic rays,
(C) a nitrogen-containing basic compound, and
(D) at least one of a fluorine-containing surfactant and a silicon-containing surfactant.

(2) A positive photosensitive resin composition comprising:
(A) a polymer which has bridged alicyclic hydrocarbon skeletons and decomposes under the action of an acid to be rendered soluble in alkali,
(B) a compound which generates an acid upon irradiation with actinic rays,
(C) a nitrogen-containing basic compound,
(D) at least one of a fluorine-containing surfactant and a silicon-containing surfactant, and
(E) a solvent;
wherein the ratio of (B) to (C) by weight is from 5 to 300 and the ratio of (A) to (D) by weight is from 500 to 20,000.

(3) A positive photosensitive resin composition according to the foregoing embodiment (1) or (2); further comprising a low molecular acid-decomposable compound which has a molecular weight of 2,000 or below and a group capable of decomposing under the action of an acid to increase its solubility in alkali.

(4) A positive photosensitive resin composition according to the foregoing embodiment (3), wherein the content of the low molecular acid-decomposable compound is from 0.5 to 20.0 parts by weight per 100 parts by weight of the total solids of the composition.

(5) A positive photosensitive resin composition according to any of the foregoing embodiments (1) to (4), wherein the compound as Component (B) is an onium salt.

(6) A positive photosensitive resin composition according to any of the foregoing embodiments (1) to (5), wherein the nitrogen-containing basic compound as Component (C) is an organic amine.

(7) A positive photosensitive resin composition according to the foregoing embodiment (2), wherein the solvent as Component (E) comprises at least one solvent selected from the group consisting of ethyl lactate, propylene glycol monomethyl ether acetate, propylene glycol monomethyl ether, propylene glycol monomethyl ether proprionate, methyl 3-methoxypropionate, ethyl 3-ethoxypropionate and 2-heptanone in an amount of at least 70% by weight based on the total solvent.

(8) A positive photosensitive resin composition according to any of the foregoing embodiments (1) to (7), wherein the actinic rays are deep ultraviolet rays having wavelengths of 220 nm or shorter.

Further, by our close investigations of ingredients to constitute a chemically amplified positive resist composition, it has been found that the aforementioned objects can be attained by combining a polymer containing alicyclic hydrocarbon skeletons in its constitutional repeating units, a photo-acid generator, a nitrogen-containing basic compound, a fluorine and/or silicon-containing surfactant and particular solvents, thereby achieving the second composition according to the present invention.

More specifically, the following (9) to (15) are embodiments of the present second composition, and thereby the aforementioned objects are attained.

(9) A positive photosensitive resin composition comprising:
(A) a polymer which has alicyclic hydrocarbon skeletons and decomposes under the action of an acid to be rendered soluble in alkali,
(B) a compound which generates an acid upon irradiation with actinic rays, (C) a nitrogen-containing basic compound,
(D) a fluorine and/or silicon-containing surfactant, and
(E) a solvent comprising as a first solvent at least one solvent selected from the following group (a) in an amount of 60 to 90% by weight based on the total solvent and as a second solvent a solvent selected from the following group (b) in an amount of 10 to 40% by weight based on the total solvent; the group (a) consisting of ethyl lactate, propylene glycol monomethyl ether acetate, propylene glycol monomethyl ether propionate, methyl 3-methoxypropionate and ethyl 3-ethoxypropionate, and the group (b) consisting of solvents having a viscosity of not higher than 1 centipoise at 20° C.

(10) A positive photosensitive resin composition according to the foregoing embodiment (9), wherein the solvent as Component (E) further comprises as a third solvent (c) a solvent having a boiling point of not lower than 180° C. and a solubility parameter of at least 12 in an amount of 1 to 20% by weight based on the total solvent.

(11) A positive photosensitive resin composition according to the foregoing embodiment (10), wherein the third solvent (c) is at least one solvent selected from the group consisting of γ-butyrolactone, ethylene carbonate and propylene carbonate.

(12) A positive photosensitive resin composition according to any of the foregoing embodiments (9) to (11), wherein the number of carbon atoms forming each of the alicyclic hydrocarbon skeletons present in the polymer as Component (A) is from 5 to 25.

(13) A positive photosensitive resin composition according to any of the foregoing embodiments (9) to (12), wherein the nitrogen-containing basic compound as Component (C) is at least one compound selected from the group consisting of organic amines, basic ammonium salts and basic sulfonium salts.

(14) A positive photosensitive resin composition according to the foregoing embodiment (9) to (12); further comprising a low molecular acid-decomposable dissolution inhibitive compound which has a molecular weight of 2,000 or below and a group capable of decomposing under the action of an acid to increase its solubility in alkali.

(15) A positive photosensitive resin composition according to any of the foregoing embodiments (9) to (14), wherein the actinic rays are deep ultraviolet rays having wavelengths of 220 nm or shorter.

Furthermore, the following (16) to (22) are embodiments of the present third composition, and thereby the aforementioned objects of the present invention are also attained.

(16) A positive photosensitive resin composition comprising:
(A) a polymer which has alicyclic hydrocarbon skeletons and decomposes under the action of an acid to be rendered soluble in alkali,
(B) a compound which generates an acid upon irradiation with actinic rays,
(C) a nitrogen-containing basic compound,
(D) a fluorine and/or silicon-containing surfactant, and
(E) a solvent comprising (a) ethyl lactate in an amount of 60 to 90% by weight based on the total solvent and (b) ethyl 3-ethoxypropionate in an amount of 10 to 40% by weight based on the total solvent.

(17) A positive photosensitive resin composition according to the foregoing embodiment (16), wherein the solvent as Component (E) further comprises a solvent (c) having a boiling point of not lower than 180° C. and a solubility parameter of at least 12 in an amount of 1 to 20% by weight based on the total solvent.

(18) A positive photosensitive resin composition according to the foregoing embodiment (17), wherein the solvent (c) is at least one solvent selected from the group consisting of γ-butyrolactone, ethylene carbonate and propylene carbonate.

(19) A positive photosensitive resin composition according to any of the foregoing embodiments (16) to (18), wherein the number of carbon atoms forming each of the alicyclic hydrocarbon skeletons present in the polymer as Component (A) is from 5 to 25.

(20) A positive photosensitive resin composition according to any of the foregoing embodiments (16) to (19), wherein the nitrogen-containing basic compound as Component (C) is at least one compound selected from the group consisting of organic amines, basic ammonium salts and basic sulfonium salts.

(21) A positive photosensitive resin composition according to the foregoing embodiment (16) to (20); further comprising a low molecular acid-decomposable dissolution inhibitive compound which has a molecular weight of 2,000 or below and a group capable of decomposing under the action of an acid to increase its solubility in alkali.

(22) A positive photosensitive resin composition according to any of the foregoing embodiments (16) to (21), wherein the actinic rays are deep ultraviolet rays having wavelengths of 220 nm or shorter.

DETAILED DESCRIPTION OF THE INVENTION

The compounds usable in the present invention are described below in greater detail.

As examples of a polymer usable as the present Component (A) which has alicyclic hydrocarbon skeletons and can have solubility in alkali by undergoing the action of an acid, mention may be made of hitherto known polymers.

With respect to the alicyclic part in such a polymer, the suitable number of carbon atoms forming the ring with a hydrocarbon skeleton is from 5 to 25, and suitable examples of such a ring structure include those illustrated below.

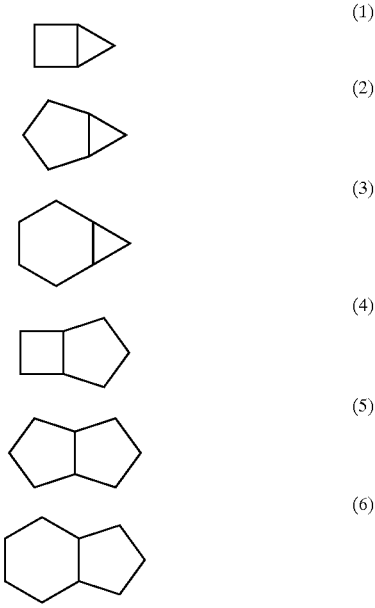

(7)
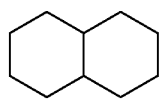
(8)
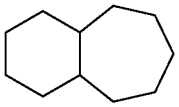
(9)
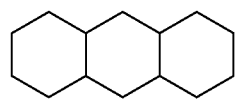
(10)
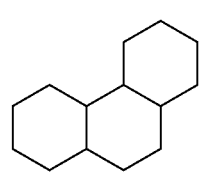
(11)
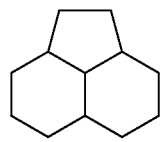
(12)
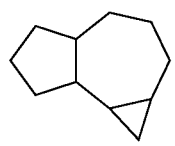
(13)
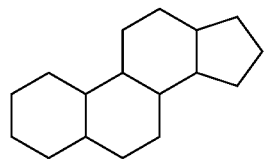
(14)
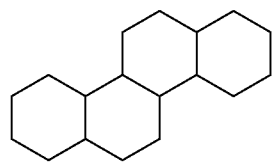
(15)
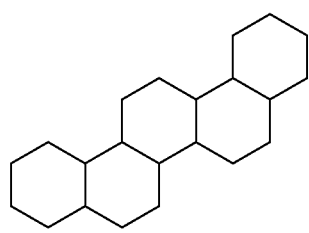
(16)
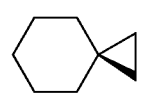
(17)
(18)
(19)
(20)
(21)
(22)
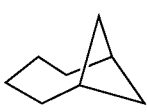
(23)
(24)
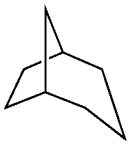
(25)
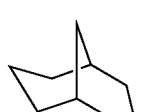
(26)
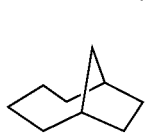
(27)
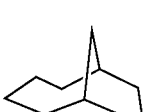
(28)
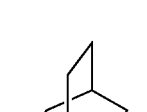
(29)
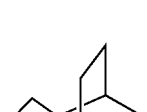

(30) 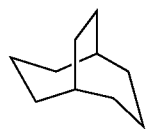

(31) 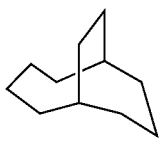

(32) 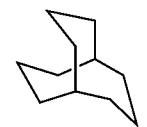

(33) 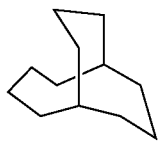

(34) 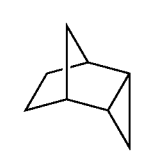

(35) 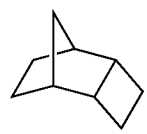

(36) 

(37) 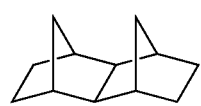

(38) 

(39) 

(40) 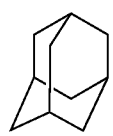

(41) 

(42) 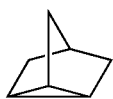

(43) 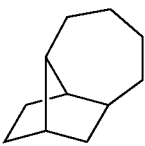

(44) 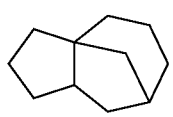

(45) 

(46) 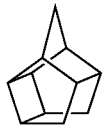

(47) 

(48) 

(49) 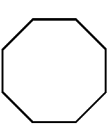

(50)

Examples of a polymer usable in the present invention include polymers comprising constitutional repeating units represented by the following structural formulae (a-1) to (a-15) respectively, wherein the alicyclic hydrocarbon skeletal units constitute the main chain of each polymer and the groups capable of decomposing under the action of an acid (hereinafter referred to as acid-decomposable groups) are also present, and polymers comprising constitutional repeating units represented by the following structural formulae (b-1) to (b-8) respectively, wherein the alicyclic hydrocarbon skeletal units and the acid-decomposable groups are present in the side chains of each polymer.

Although it is essential for the polymers relating to the present invention to contain constitutional repeating units having alicyclic hydrocarbon skeletal structures, such as those represented by the following structural formulae (a-1) to (a-15) and (b-1) to (b-8), the polymers may further contain as copolymerizing component the constitutional repeating units represented by the following structural formulae (c-1) to (c-4).

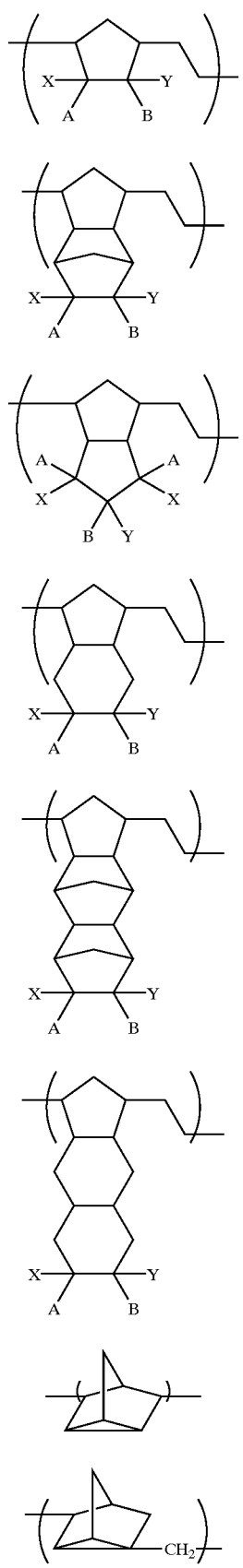
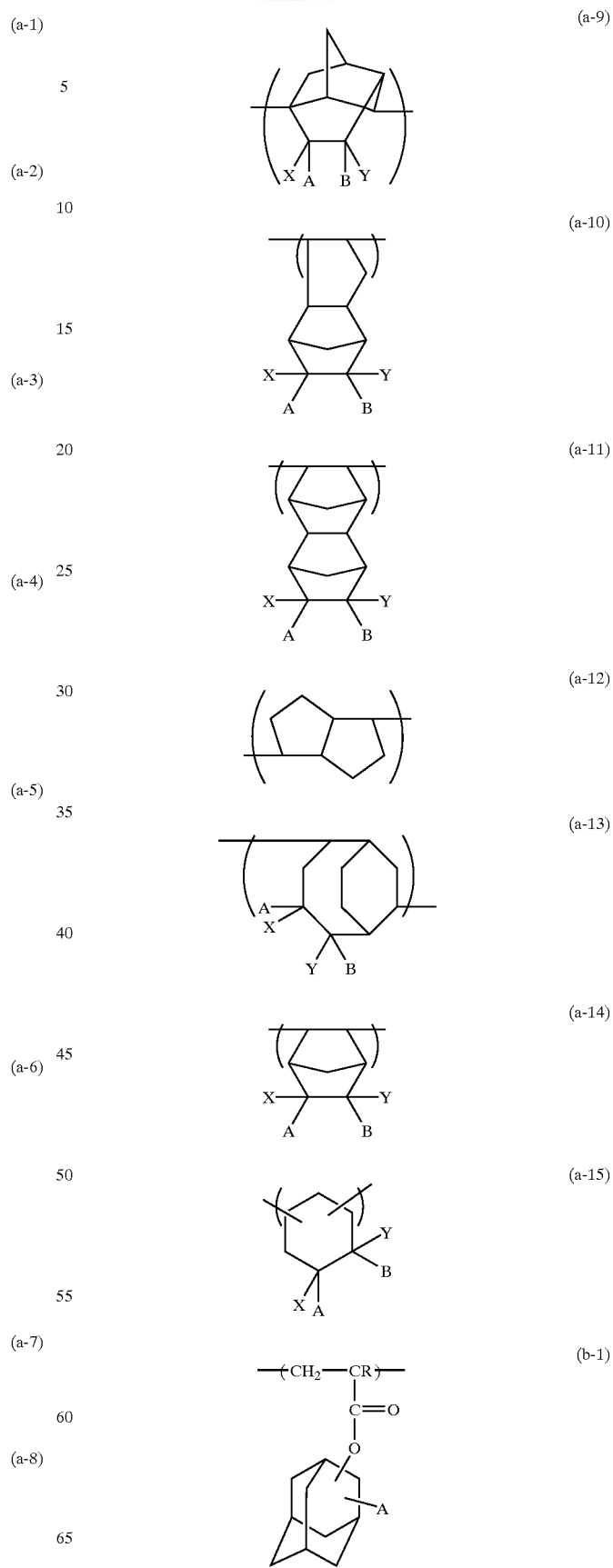

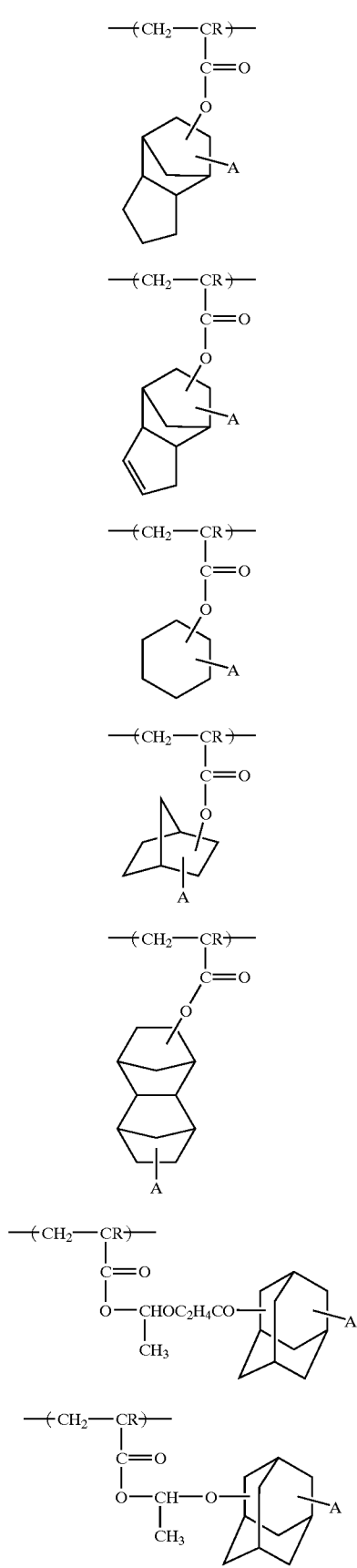

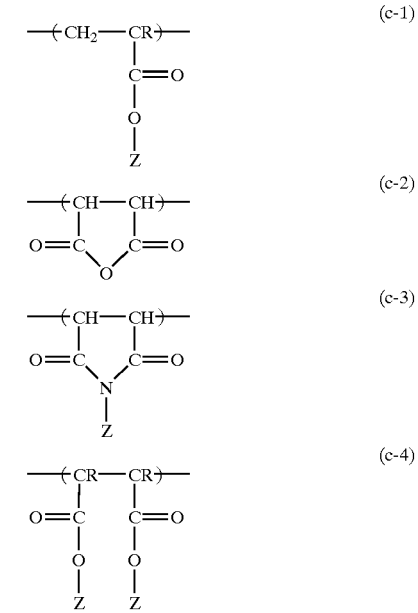

In each of the foregoing structural units (a-1) to (a-15) and (b-1) to (b-8), A and B each independently represents a hydrogen atom, a hydroxyl group, a carboxyl group, an alkoxycarbonyl group, or a substituted or unsubstituted alkyl, alkoxy or alkenyl group containing 1 to 10 carbon atoms, or they may combine with each other to form a ring. X and Y each independently represents a group capable of decomposing under the action of an acid.

In each of the foregoing structural units (b-1) to (b-8) and (c-1) to (c-4), R represents a hydrogen atom or an alkyl group having 1 to 3 carbon atoms, such as a methyl group. Z in the foregoing structural units (c-1), (c-3) and (c-4) each represents a hydrogen atom, a substituted or unsubstituted alkyl group containing 1 to 10 carbon atoms, an alkoxycarbonyl group or a group capable of decomposing under the action of an acid.

Suitable examples of an alkoxycarbonyl group as mentioned above include methoxycarbonyl, ethoxycarbonyl and butoxy-carbonyl groups.

The aforementioned alkyl group containing 1 to 10 carbon atoms includes unsubstituted or substituted straight-chain, branched and cyclic alkyl groups. More specifically, methyl, ethyl, propyl, isopropyl, n-butyl, t-butyl, cyclopentyl, cyclohexyl, hydroxymethyl and hydroxyethyl groups are included therein.

Examples of an alkoxy group containing 1 to 10 carbon atoms include methoxy, ethoxy, n-butoxy, t-butoxy, propoxy and isopropoxy groups.

Examples of an alkenyl group containing 2 to 10 carbon atoms include allyl, vinyl and 2-propenyl groups.

In the case of forming a ring by combining A and B, the moiety formed by combining A and B is, e.g., —C(=O)—O—C(=O)—, —C(=O)—NH—C(=O)— or —CH$_2$—C(=O)—O—C(=O)—.

The group capable of decomposing under the action of an acid can be represented by, e.g., —(CH$_2$)$_n$—COORa or —(CH$_2$)$_n$—OCORb. Herein, Ra represents a hydrocarbon group having 2 to 20 carbon atoms, with examples including t-butyl, norbornyl and cyclodecanyl groups. Rb represents a tetrahydrofranyl group, a tetrahydropyranyl group, an alkoxyethyl group such as ethoxyethyl or isopropoxyethyl, a lactone group, or a cyclohexyloxyethyl group. n is 0 or 1.

Each of the groups as recited above may further have a substituent group, such as a halogen atom, a cyano group or a nitro group.

Of the alicyclic hydrocarbon skeletons contained in polymers usable as the present Component (A) (which are referred to as Polymers (A) hereinafter), those having a bridged structure are preferred. The presence of the bridged structures in Polymers (A) can contribute to improvement in image characteristics (e.g., resist profile and defocus latitude). Examples of a constitutional repeating unit having such a bridged alicyclic hydrocarbon skeleton include the foregoing structural units (a-2) to (a-14), (b-1) to (b-3) and (b-5) to (b-8).

The Polymers (A) comprising the constitutional repeating units represented by (a-1) to (a-6) can be prepared by, e.g., subjecting cyclic olefins to ring-opening polymerization in an organic solvent or a non-organic solvent in the presence of a metathesis catalyst, and subsequently hydrogenating the polymerized product. The ring-opening (co)polymerization can be carried out with ease using the synthesis methods described in, e.g., W. L. Truett et al., *J. Am. Chem. Soc.*, 82, 2337 (1960), A. Pacreau, *Macromol. Chem.*, 188, 2585 (1987), JP-A-51-31800, JP-A-1-197460, JP-A-2-42094 and European Patent 0789278. As examples of a metathesis catalyst used therein, mention may be made of the compounds described in, e.g., *Syntheses and Reactions of Polymers (I)*, pp. 375–381, compiled by Polymer Society of Japan, published by Kyoritsu Shuppan in 1992, and JP-A-49-77999, more specifically the catalytic system constituted of a halogen compound of transition metal, such as tungsten and/or molybdenum, and an organoaluminum compound, and the catalytic system constituted of those compounds and the third component.

Examples of such tungsten and molybdenum compounds include molybdenum pentachloride, tungsten hexachloride and tungsten oxytetrachloride. And examples of an organoaluminum compound include triethylaluminum, triisobutylaluminum, trihexylaluminum, diethylaluminum monochloride, di-n-butylaluminum monochloride, ethylaluminum sesquichloride, diethylaluminum monobutoxide and triethylaluminum-water (1:0.5 by mole). In carrying out the ring-opening polymerization, it is desirable that the organoaluminum compound be used in an amount of at least 0.5 mole to 1 mole of tungsten or molybdenum compound.

Examples of the third component used in the foregoing catalytic system for improving the polymerizing activity and so on include water, hydrogen peroxide, oxygen-containing organic compounds, nitrogen-containing organic compounds, halogen-containing organic compounds, phosphorus-containing organic compounds, sulfur-containing organic compounds and metal-containing organic compounds. Such a compound as the third component is used in an amount of at most 5 moles per mole of tungsten or molybdenum compound. Such a catalytic system and monomers are used in an amount of generally from 0.1:100 to 20:100 by mole, though the proportion depends on their species.

The suitable temperature during the ring-opening (co) polymerization is from −40° C. to +150° C., and it is desirable that the polymerization be carried out in an atmosphere of inert gas. Examples of a solvent usable therein include aliphatic hydrocarbons, such as pentane, hexane, heptane and octane; alicyclic hydrocarbons, such as cyclopentane and cyclohexane; aromatic hydrocarbons, such as benzene, toluene and xylene; halogenated hydrocarbons, such as methylene chloride, 1,1-dichloroethane, 1,2-dichloroethane, 1-chloropropane, 1-chlorobutane, 1-chloropentane, chlorobenzene, bromobenzene, o-dichlorobenzene and m-dichlorobenzene; and ether compounds, such as diethyl ether and tetrahydrofuran.

The polymers produced by the ring-opening (co) polymerization as mentioned above are hydrogenated to yield Polymers (A) usable in the present invention. The catalysts usable in the hydrogenation reaction are heterogeneous catalysts and homogeneous catalysts used for general hydrogenation reaction of olefinic compounds.

For instance, each of such heterogeneous catalysts is a solid catalyst comprising a precious metal catalyst, such as palladium, platinum, nickel, ruthenium or rhodium, supported by a carrier such as carbon, silica, alumina or titania. And those homogeneous catalysts include nickel naphthenate/triethyl-aluminum, nickel acetylacetonate/triethylaluminum, cobalt octenate/n-butyllithium, titanocene dichloride/diethyl-aluminum monochloride, and rhodium catalysts, such as rhodium acetate and chlorotris (triphenylphosphine)rhodium.

Of these catalysts, the heterogeneous catalysts are advantageous over the others, because they have high reactivity, can be removed with ease after reaction and leave no stain on polymers produced.

The hydrogenation reaction can be carried out at a temperature from 0° C. to 200° C., preferably from 20° C. to 180° C., in a hydrogen gas atmosphere of from ordinary pressure to 300 atmospheric pressure, preferably from 3 to 200 atmospheric pressure. The hydrogenation rate is generally at least 50%, preferably at least 70%, more preferably at least 80%. When the hydrogenation rate is lower than 50%, the polymers produced have undesirable influence upon thermal stability and storage stability of the resulting resist.

The polymers comprising the constitutional repeating units (a-7) to (a-15) as illustrated above can be synthesized, e.g., by radical (co)polymerization of alicyclic hydrocarbon monomers in the presence of an effective amount of free radical polymerization initiator. More specifically, they can be synthesized using the methods described in, e.g., *J. Macromol. Sci. Chem.*, A-5(3) 491 (1971), ibid., A-5(8) 1339 (1971), *Polym. Lett.*, Vol. 2, 469 (1964), U.S. Pat. Nos. 3,143,533, 3,261,815, 3,510,461, 3,793,510 and 3,703,501, and JP-A-2-146045.

Suitable examples of an initiator used in the radical (co)polymerization include 2,2'-azobis(2-methylpropane-nitrile), benzoyl peroxide and dicumyl peroxide. The initiator concentration is generally from 0.01 to 10% by weight, preferably from 0.1 to 5% by weight, based on the total weight of monomers. The polymerization temperature can be widely changed. Specifically, it is generally from room temperature to 250° C., preferably from 40 to 200° C., more preferably from 60 to 160° C.

It is desirable that the polymerization or copolymerization be carried out in an organic solvent. The organic solvents capable of dissolving monomers at the prescribed temperature, and the polymers produced as well, are suitably used therein. The suitable solvents, though depend on the species of monomers to be copolymerized, include aromatic hydrocarbons, such as toluene; aliphatic esters, such as ethyl acetate, and aromatic esters; and aliphatic ethers, such as tetrahydrofuran.

After running the reaction for the prescribed time, it is desirable to carry out the distillation under reduced pressure and purification for the purpose of separating the polymer obtained from the monomers remaining unreacted, the solvent used and so on.

The polymers having the constitutional repeating units (b-1) to (b-8) or the polymers containing the copolymerizing components (c-1) to (c-4) can be synthesized by radical (co)polymerization in the presence of an effective amount of free radical initiator.

The suitable proportion of the constitutional units having alicyclic skeletons is at least 10 mole %, preferably at least 20 mole %, more preferably at least 30 mole %, to the total constitutional units in Polymer (A).

On the other hand, the suitable proportion of the constitutional units having acid-decomposable groups is from 10 to 90 mole %, preferably from 15 to 85 mole %, more preferably from 20 to 80 mole %, to the total constitutional units in Polymer (A).

For the polymer used in the present invention, it is desirable that the proportion of a copolymerizing component as represented by (c-1) to (c-4) be from 3 to 60 mole %, preferably from 5 to 55 mole %, more preferably from 10 to 50 mole %, to the total constitutional repeating units.

The suitable weight-average molecular weight of Polymer (A) is from 1,500 to 100,000, preferably from 2,000 to 70,000, particularly preferably from 3,000 to 50,000. When the polymer (A) has a molecular weight lower than 1,500, the resulting composition cannot have sufficient dry etching resistance, heat resistance and adhesiveness to a substrate; while the molecular weight is higher than 100,000, the resist sensitivity is lowered. The suitable molecular weight distribution (Mw/Mn) is from 1.0 to 6.0, preferably from 1.0 to 4.0. The smaller Mw/Mn value the polymer (A) has, the higher heat resistance and the better image properties (e.g., resist profile, defocus latitude) can be obtained. In addition, the presence of unreacted monomers in the polymer product is undesirable, because it causes deterioration in dry etching resistance and a drop in transmittance of the resist film. Therefore, it is desirable that the proportion of unreacted monomers in the polymer product be lowered to 2% by weight at the most, preferably 1% by weight or below.

Additionally, the weight-average molecular weight and molecular weight distribution (Mw/Mn) of Polymer (A) are determined as polystyrene equivalents by gel permeation chromatography equipped with a refractive index detector.

The content of Polymer (A) in the present positive photosensitive resin composition is from 50 to 99.7% by weight, preferably from 70 to 99% by weight, on a solids basis.

The present positive photosensitive resin composition can contain polymers other than Polymer (A), if needed. The suitable content of other polymers is not higher than 30 parts by weight, preferably not higher than 20 parts by weight, more preferably not higher than 10 parts by weight, particularly preferably not higher than 5 parts by weight, per 100 parts by weight of Polymer (A).

As the foregoing other polymers, any polymers may be contained in the present composition, provided that they are compatible with Polymer (A) as an alicyclic polymer according to the present invention. Specifically, poly(p-hydroxystyrene), hydrogenated poly(p-hydroxystyrene) and novolak resin.

Secondly, the compounds which decompose upon irradiation with actinic rays to generate an acid are illustrated below, which are usable as Component (B) of the present positive photosensitive resin composition (which are referred to as Photo-acid Generator (B) hereinafter).

Examples of Photo-acid Generator (B) used in the present invention include photo initiators of photo cationic polymerization, photo initiators of photo radical polymerization, photo decolorants of dyes, photo discoloration agents and photo-acid generators known in the field of micro photoresist to generate acids upon irradiation with ultraviolet rays, deep ultraviolet rays, XrF excimer laser beams, ArF excimer laser beams, electron beams, X-rays, molecular beams or ion beams. Two or more agents selected properly from the above-recited ones may be used as a mixture, too.

Additionally, the concept of the term, "actinic rays" used in the present invention is broad, and includes the radiant rays as recited above.

The Photo-acid Generator (B) has no particular restriction, provided that it can be dissolved in organic solvents, which are described later, used for the present positive photosensitive resin composition. However, it is desirable that the Photo-acid Generator (B) be a photo-acid generator capable of generating an acid upon irradiation with light of wavelengths of 220 nm or shorter. Such photo-acid generators may be used alone or as a mixture of two or more thereof, or in combination with an appropriate sensitizer.

Examples of a photo-acid generator usable as Photo-acid Generator (B) include the triphenylsulfonium salt derivatives described in J. Org. Chem., Vol. 43, No. 15, 3055 (1978), and the other onium salts (including sulfonium salts, iodonium salts, phosphonium salts, diazonium salts and ammonium salts) disclosed in Japanese Patent Application No. 9-279071.

As examples of an onium salt, mention may be made of diphenyliodonium triflate, diphenyliodonium pyrenesulfonate, diphenyliodonium dodecylbenzenesulfonate, triphenylsulfonium triflate, triphenylsulfonium hexafluoroantimonate, diphenyliodonium hexafluoroantimonate, triphenylsulfonium naphthalenesulfonate, triphenylsulfonium camphorsulfonate, (4-methoxyphenyl) phenyliodonium trifluoromethanesulfonate and bis(t-butylphenyl)iodonium trifluoromethanesulfonate.

Further, the diazodisulfones and diazoketosulfones disclosed in JP-A-3-103854, JP-A-3-103856 and JP-A-4-1210960, the iminosulfonates disclosed in JP-A-64-18143 and JP-A-2-245756 and the disulfones disclosed in JP-A-2-71270 can be used to advantage. Furthermore, the polymers having groups generating acids upon exposure to light in their main or side chains as disclosed in, e.g., U.S. Pat. No. 3,849,137, JP-A-63-26653, JP-A-62-69263, JP-A-63-146038, JP-A-63-163452, JP-A-62-153853 and JP-A-63-146029 can also be used. In addition, the 2-oxocyclohexyl group-containing aliphatic alkylsulfonium salts and the N-hydroxysuccinimide sulfonates disclosed in JP-A-7-25846, JP-A-7-28237, JP-A-7-92675 and JP-A-8-27120, and the sulfonium salts described in J. Photopolym. Sci. Tech., Vol. 7, NO. 3, 423 (1994) can also be used to advantage. These photo-acid generators are used alone or as a mixture of two or more thereof.

Of these photo-acid generators, the onium salts are preferred over the others because they can ensure good sensitivity and resolution in the resulting resist.

With respect to the first composition, the proportion of such a compound as to generate an acid upon irradiation with actinic rays (Component (B)) is generally from 0.001 to 40% by weight, preferably from 0.01 to 20% by weight, more preferably from 0.1 to 15% by weight, particularly preferably from 0.5 to 10% by weight, based on the total weight (on a solids basis) of the present photosensitive resin compositions. With respect to the second and third compositions, the proportion of Component (B) is generally from 0.001 to 40% by weight, preferably from 0.01 to 20% by weight, more preferably from 0.1 to 5% by weight based on the total weight (on a solids basis) of the composition. When the proportion of Photo-acid Generator (B) is lower than 0.001% by weight, the sensitivity is lowered; while, when it is higher than 40% by weight, the resulting resist shows too high absorption of light, and thereby the profile is deteriorated and the process margin, particularly bake margin, is rendered narrow.

Thirdly, the nitrogen-containing basic compounds contained as Component (C) in the present positive photosensitive resin composition (which are referred to as Basic Compound (C) hereinafter) are illustrated below.

As Basic Compound (C), organic amines, basic ammonium salts and basic sulfonium salts can be employed in terms of obtaining high sensitivity, high resolution and excellent profile, so far as they cause no deterioration in sublimation and resist properties. Of such basic compounds, organic amines are preferred over the others because they can ensure excellent image quality.

Secifically, usable basic compounds are those disclosed in, e.g., JP-A-63-149640, JP-A-5-249662, JP-A-5-127369, JP-A-5-289322, JP-A-5-2496832, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-C-7-508840, and U.S. Pat. Nos. 5,525,453, 5,629,134 and 5,667,938.

Suitable examples of a nitrogen-containing basic compound as Component (C) include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenylether, pyridinium p-toluenesulfonate, 2,4,6-trimethylpyridinium p-toluenesulfonate, tetramethylammonium p-toluenesulfonate, tetrabutylammonium lactate, triethylamine and tributylamine.

Of these compounds, organic amines such as 1,5-diazabicyclo[4.3.0]-5-nonene, 1,8-diazabicyclo[5.4.0]-7-undecene, 1,4-diazabicyclo-[2.2.2]octane, 4-dimethylaminopyridine, 1-naphthylamine, piperidine, hexamethylenetetramine, imidazoles, hydroxy-pyridines, pyridines, 4,4'-diaminodiphenylether, triethylamine and tributylamine are advantageous.

With respect to the first composition, the content of Basic Compound (C) is generally from 0.001 to 10 parts by weight, preferably from 0.001 to 5 parts by weight, more preferably from 0.001 to 0.5 parts by weight, per 100 parts by weight of the composition (on a solids basis). With respect to the second and third compositions, the content of Basic Compound (C) is generally from 0.001 to 10 parts by weight, preferably from 0.01 to 5 parts by weight, per 100 parts by weight of the composition (on a solids basis). When the content is less than 0.001 parts by weight, the addition of Component (C) cannot produce satisfactory effect; while, when it is increased beyond 10 parts by weight, the sensitivity and the developability in the unexposed area show a tendency to considerably deteriorate. The compounds recited above as Basic Compound (C) can be used alone or as a mixture of two or more thereof.

The suitable ratio of the foregoing Photo-acid Generator (B) to the foregoing nitrogen-containing Basic Compound (C) ((B)/(C) ratio) in the present composition is from 5 to 300 by weight, preferably from 10 to 200 by weight. When the (B)/(C) ratio is controlled to the aforesaid range, the resist sensitivity and the resolution are improved and the dependency of the pattern line width on the post exposure drawn-out period (PED dependency) is reduced. In other words, the improvement in resist sensitivity and resolution and the reduction of PED dependency are compatible with each other when the Components (B) and (C) are mixed within the limits of the ratio mentioned above.

Fourthly, the fluorine and/or silicon-containing surfactants which can be contained as Component (D) in the present positive photosensitive resin composition are illustrated below.

In the present photosensitive resin composition, any or at least two of fluorine-containing surfactants, silicon-containing surfactants and surfactants containing both fluorine and silicon atoms can be contained.

Examples of a surfactant usable as Component (D) include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Further, the following commercially produced surfactants can be used as they are.

As examples thereof, mention may be made of the fluorine and/or silicon-containing surfactants available in the following trade names, EFtop EF301 and EF303 (produced by Shin-Akita Kasei K.K.), Florad FC430, 431 (produced by Sumitomo 3M Inc.), Megafac F172, F173, F176, F189, R08 (produced by Dainippon Ink & Chemicals, Inc.) and Surflon S-382, SC 101, 102, 103, 104, 105, 106 (produced by Asahi Glass Co., Ltd.). In addition, the polysiloxane polymer KP-341 (produced by Shin-Etsu Chemical Co., Ltd.) can also be used as silicon-containing surfactant.

With respect to the first composition, the amount of Surfactant (D) mixed is generally from 0.001 to 2 parts by weight, preferably from 0.003 to 0.10 parts by weight, per 100 parts by weight of solids in the composition. With respect to the second and third compositions, the amount of Surfactant (D) mixed is generally from 0.01 to 2 parts by weight, preferably from 0.01 to 1 parts by weight, per 100 parts by weight of solids in the composition.

Those surfactants can be used alone or as a mixture of two or more thereof.

Further, it is desirable in the present composition that the ratio of Polymer (A) to Surfactant (D) ((A)/(D) ratio) be from 500 to 20,000 by weight, preferably from 1,000 to 15,000 by weight. By controlling the (A)/(D) ratio to the foregoing range, the developability, the line-width reproducibility and the uniformity in coated film thickness are improved.

Although no clear reason why the present positive photosensitive resin composition is especially effective for development defects can be set forth, such a special effect can be supposed to be developed by the combined use of Basic Compound (C) and particular Surfactant (D). This is because the image quality, such as profile, becomes unsatisfactory when the Basic Compound (C) is used in combination with a surfactant other than Surfactant (D), e.g., a nonionic surfactant not containing a fluorine atom or a silicon atom.

The present positive photosensitive resin composition can further contain a low molecular acid-decomposable compound, if needed, which has a molecular weight of not higher than 2,000 and a group capable of decomposing under the action of an acid and can increase its solubility in alkali under the action of an acid.

Examples of such a low molecular acid-decomposable compound include the acid-decomposable group-containing alicyclic compounds, such as cholic acid derivative, dehydrocholic acid derivatives, deoxycholic acid derivatives, lithocholic acid derivative, ursocholic acid derivatives and abietic acid derivatives, and the acid-decomposable group-containing aromatic compounds, such as naphthalene derivatives, as described in *Proc. SPIE*, 2724, 355 (1996), JP-A-8-15865, U.S. Pat. Nos. 5,310,619 and 5,372,912, and *J. Photopolym. Sci. Tech.*, Vol. 10, No. 3, 511 (1997).

Furthermore, the low molecular acid-decomposable dissolution inhibitive compounds disclosed in JP-A-6-51519 can be added in such an amount as not to lower the transmittance at 220 nm, and 1,2-naphthoquinonediazide compound can also be used.

In a case where the foregoing low molecular acid-decomposable dissolution inhibitive compound is used in the first composition, the content thereof is generally from 0.5 to 50 parts by weight, preferably from 0.5 to 40 parts by weight, more preferably from 0.5 to 30 parts by weight, particularly preferably from 0.5 to 20.0 parts by weight, per 100 parts by weight of photosensitive resin composition (on a solids basis). In a case where the foregoing low molecular acid-decomposable dissolution inhibitive compound is used in the second and third compositions, the content thereof is generally from 1 to 50 parts by weight, preferably from 3 to 40 parts by weight, more preferably from 5 to 30 parts by weight, per 100 parts by weight of photosensitive resin composition (on a solids basis).

The addition of such a low molecular acid-decomposable dissolution inhibitive compound can produce not only further improvement in the aforementioned development defects, but also betterment in dry etching resistance.

In addition, the present positive photosensitive resin composition can contain compounds capable of promoting the dissolution in a developer, anti-halation agents, plasticizers, surfactants, photosensitizers, adhesion aids, cross-linking agents, photo-base generators and so on, if desired.

As examples of a compound capable of promoting the dissolution in a developer, which can be used in the present invention, mention may be made of the low molecular compounds having molecular weight of not higher than 1,000 as disclosed in JP-A-3-206458, such as compounds containing at least two phenolic hydroxyl groups per molecule, naphthols such as 1-naphthol, compounds containing at least one carboxyl group per molecule, carboxylic acid anhydrides, sulfonamide compounds and sulfonylimide compounds.

The proportion of such a dissolution promoting compound admixed is preferably 30% by weight or below, more preferably 20% by weight or below, based on the total weight of the composition (on a solids basis).

Suitable anti-halation agents are compounds capable of absorbing the radiant rays irradiated, with examples including substituted benzenes, such as fluorene, 9-fluorenone and benzophenone; and polycyclic aromatic compounds, such as anthracene, anthracene-9-methanol, anthracene-9-carboxyethyl, phenanthrene, perylene and azulene. Of these compounds, polycyclic aromatic compounds are preferred in particular. These anti-halation agents can reduce the reflected light from a substrate to lessen the influence of multiple reflection inside the resist film, and thereby the effect of standing wave improvement is developed.

For the purpose of improving the coating suitability and developability of the present photosensitive resin composition, nonionic surfactants can be used together.

Examples of a nonionic surfactant usable for such a purpose include polyoxyethylene lauryl ether, polyoxyethylene stearyl ether, polyoxyethylene octyl phenyl ether, polyoxyethylene nonyl phenyl etheer, polyethylene glycol dilaurate, polyethylene glycol distearate, polyoxyethylene sorbitane monostearate and sorbitane monolaurate.

For the purpose of elevating the rate of acid generation by exposure, photosensitizers can be added. Suitable examples of such a photosensitizer include benzophenone, p,p'-tetramethyldiaminobenzophenone, 2-chlorothioxanthone, anthrone, 9-ethoxyanthracene, pyrene, phenothiazine, benzil, benzoflavin, acetophenone, phenanthrene, benzoquinone, anthraquinone and 1,2-naphthoquinone. These photosensitizers can also be used as the anti-halation agents as mentioned above.

In general, the first photosensitive resin composition is prepared in the form of a solution by dissolving the above-illustrated components in an appropriate solvent and then filtering through a filter having a pore size of the order of 0.05 to 0.2 $\mu$m. Examples of a solvent appropriately used therein include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl $\beta$-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, $\gamma$-butyrolactone and N,N-dimethylacetamide. These solvents can be used alone or as a combination of two or more thereof. From the viewpoint of ensuring satisfactory solubility, coating suitability on a substrate and storage stability for the photosensitive resin composition, it is desirable that at least 70% by weight of the total solvents used be at least one solvent selected from the group consisting of ethyl lactate, propylene glycol monomethyl ether acetate, propylene glycol monomethyl ether, propylene glycol monomethyl ether propionate, methyl 3-methoxy-propionate, ethyl 3-ethoxypropionate and 2-heptanone.

In addition, it is desirable that the water content in the solvents used be as low as possible, because water has adverse effect on resist characteristics.

Further, it is desirable that the content of impurities, such as metals and chlorine ion, in the present photosensitive resin composition be reduced to 100 ppb or below. If the content of those impurities is not low, troubles such as poor workings, defects and yield drop are caused during the production of semiconductor devices.

Next, the solvents used as Component (E) in the second composition according to the present invention are illustrated below.

The first solvent (a) used in the present second composition is at least one solvent selected from the group consisting of ethyl lactate, propylene glycol monomethyl ether acetate, propylene glycol monomethyl ether propionate, methyl 3-methoxy-propionate and ethyl 3-ethoxypropionate. Of these solvents, ethyl lactate and propylene glycol monomethyl ether acetate are preferred in particular.

The first solvent (a) is used in an amount of from 60 to 90% by weight, preferably from 60 to 85% by weight, more preferably from 65 to 80% by weight, based on the total solvents as component (E).

The second solvent (b) used in the present second composition is a solvent having viscosity of 1 centipoise at the highest, preferably 0.9 centipoise at the highest, at 20° C. Any solvents can be used as the second solvent (b) so far as they meet the aforesaid viscosity requirement. Examples of an organic solvent having such viscosity include methyl acetate, ethyl acetate, propyl acetate, isopropyl acetate, butyl acetate, isobutyl acetate, methyl ethyl ketone, methyl amyl ketone and methyl isobutyl ketone. Of these solvents, butyl acetate is preferred in particular. These solvents can be used alone, as a mixture of two or more thereof.

The second solvent (b) is used in an amount of from 10 to 40% by weight, preferably from 10 to 30% by weight, more preferably from 10 to 25% by weight, based on the total solvents as component (E).

The sum total of the first solvent (a) and the second solvent (b) desirably comprises at least 70% by weight of the total solvents as Component (E). When the proportion is less than 70% by weight, it sometimes occurs that the objects of the present invention cannot be fully achieved.

In addition to the first solvent (a) and the second solvent (b), it is desirable to use the third solvent (c) in the present second composition. The third solvent (c) is a solvent having a boiling point (b.p.) of 180° C. or above, preferably 185° C. or above, and a solubility parameter (SP value) of at least 12, preferably at least 12.4, and such a solvent is preferably used in an amount of from 1 to 20% by weight, more preferably from 3 to 10% by weight, based on the total solvents as Component (E).

The addition of the third solvent (c) can produce an appreciable improvement in development defects. However, the addition in an amount higher than 20% by weight causes deterioration in adhesiveness to a substrate.

Examples of a solvent usable as the third solvent (c) include γ-butyrolactone (b.p.: 190° C., SP value: 12.6), propylene carbonate (b.p.: 242° C., SP value: 13.3), ethylene carbonate (b.p.: 239° C., SP value: 14.7), N,N-dimethylimidazolinone (b.p.: 200° C., SP value: 12.4) and dimethyl sulfoxide (b.p.: 189° C., SP value: 13.0). Of these solvents, γ-butyrolactone, propylene carbonate and ethylene carbonate are preferred in particular with respect to the achievement of the present effects.

Although it is desirable to use the solvents recited above as Component (E), other solvents may be used together in such an amount as not to mar the present effects, specifically not higher than 5% by weight.

As the other solvents, cyclohexanone, propylene glycol monomethyl ether, methyl β-methoxyisobutyrate, ethyl butyrate, propyl butyrate, diacetone alcohol, N-methylpyrrolidone and so on are usable.

Now, the solvents used as Component (E) in the third composition according to the present invention are illustrated.

The Component (E) of the third composition comprises (a) ethyl lactate and (b) ethyl 3-ethoxypropionate. The ethyl lactate (a) as the main solvent is used in an amount of from 60 to 90% by weight, preferably from 60 to 85% by weight, more preferably from 65 to 80% by weight, based on the total solvents used as Component (E).

The proportion of ethyl 3-ethoxypropionate (b) used in combination with ethyl lactate (a) in the Component (E) is from 10 to 40% by weight, preferably from 10 to 30% by weight, more preferably from 10 to 25% by weight.

The sum total of ethyl lactate (a) and ethyl 3-ethoxypropionate (b) desirably comprises at least 70% by weight of the total solvents as Component (E). When the proportion is less than 70% by weight, it sometimes occurs that the objects of the present invention cannot be fully achieved.

In addition to the foregoing solvents (a) and (b), it is desirable to use another solvent (c) in the present third composition. The solvent (c) is a solvent having a boiling point of 180° C. or above, preferably 185° C. or above, and a solubility parameter (SP value) of at least 12, preferably at least 12.4, and such a solvent is desirably used in an amount of from 1 to 20% by weight, preferably from 3 to 15% by weight, based on the total solvents as Component (E).

The addition of the solvent (c) can produce an appreciable improvement in development defects. However, the addition in an amount higher than 20% by weight causes deterioration in adhesiveness to a substrate.

Examples of a solvent (c) include γ-butyrolactone (b.p.: 190° C., SP value: 12.6), propylene carbonate (b.p.: 242° C., SP value: 13.3), ethylene carbonate (b.p.: 239° C., SP value: 14.7), N,N-dimethylimidazolinone (b.p.: 200° C., SP value: 12.4) and dimethyl sulfoxide (b.p.: 189° C., SP value: 13.0). Of these solvents, γ-butyrolactone, propylene carbonate and ethylene carbonate are preferred in particular with respect to the achievement of the present effects.

These solvents (c) can be used alone or as a mixture of two or two thereof.

Although it is desirable to use the solvents recited above as Component (E), other solvents may be used together in such an amount as not to mar the present effects, specifically not higher than 5% by weight.

Examples of other solvents usable for Component (E) include cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxy-propionate, methyl β-methoxyisobutyrate, ethyl butyrate, propyl butyrate, methyl isobutyl ketone, ethyl acetate, isoamyl acetate, diacetone alcohol and N-methylpyrrolidone.

Each of the photosensitive resin compositions according to the present invention is coated on a substrate by means of an appropriate coating apparatus, such as a spinner or a coater, subjected to pre-bake (heating prior to exposure), exposed to light of wavelengths of no longer than 220 nm via the desired mask, subjected to PEB (post-exposure bake), and then developed to provide resist patterns of good quality.

The substrate used herein may be any of substrates generally used in semiconductor devices and other manufacturing apparatus, with examples including a silicon substrate, a glass substrate and non-magnetic ceramic substrate. On such a substrate, an additional layer, e.g., a silicon oxide layer, a wiring metal layer, a layer insulation film, a magnetic layer or a reflection inhibitive film layer, may be present, if desired; and also various wiring and circuits may be built into such a substrate. Further, those substrates may undergo hydrophobicity-conferring treatment according to a conventional method for the purpose of enhancing their adhesiveness to resist film. As an example of a suitable agent for conferring hydrophobicity onto those substrates, 1,1,1,3,3,3-hexamethyldisilazane (HMDS) can be given.

The suitable thickness of a resist film coated on a substrate is in a range of about 0.1 to about 10 μm, and the thickness from about 0.1 μm to about 1.5 μm is recommended in the case of ArF exposure.

It is desirable for the resist film coated on a substrate to undergo pre-bake for about 30–300 seconds at about 60–160° C. The lower the pre-bake temperature and the shorter the pre-bake time, the greater the increase in quantity of solvent remaining in the resist film; as a result, bad influences, e.g., deterioration in the adhesiveness, are more liable to be caused. In the opposite case where the pre-bake temperature is higher and the pre-bake time is shorter than the foregoing limits, troubles, such as the decomposition of components in each photosensitive resin composition, such as a binder and a photo-acid generator, tend to be caused.

For radiation exposure of resist films after pre-bake, commercially available ultraviolet exposure apparatus, X-ray exposure apparatus, electron-beam exposure apparatus, KrF excimer exposure apparatus, ArF excimer exposure apparatus, $F_2$ excimer exposure apparatus and so on can be employed. In particular, the exposure apparatus using ArF excimer laser as light source is advantageous to the present invention.

The post-exposure bake is carried out for the purpose of causing the elimination of protective groups by the use of acids as catalyst, the disappearance of standing wave, the diffusion of acid generators in resist film, and so on. This post-exposure bake can be effected similarly to the pre-exposure bake. For instance, the baking temperature is in the range of about 60 to 160° C., preferably about 90 to 150° C.

Examples of a developer which can be used for the present photosensitive resin compositions include aqueous solutions of various alkalis, such as inorganic alkalis (e.g., sodium hydroxide, potassium hydroxide, sodium carbonate, sodium silicate, aqueous ammonia), primary amines (e.g., ethylamine, n-propylamine), secondary amines (e.g., diethylamine, di-n-butylamine), tertiary amines (e.g., triethylamine, methyldiethylamine), alcoholamines (e.g., dimethylethanolamine, triethanolamine), quaternary ammonium salts (e.g., tetramethylammonium hydroxide (TMAH), tetraethylammonium hydroxide (TEAH), trimethylhydroxymethylammonium hydroxide, triethylhydroxymethylammonium hydroxide, trimethylhydroxyethylammonium hydroxide), and cyclic amines (e.g., pyrrole, piperidine, 1,8-diazabicyclo-[5.4.0]-7-undecene, 1,5-diazabicyclo-[4.3.0]-5-nonane).

To the foregoing aqueous alkaline solutions, hydrophilic organic solvents, such as alcohols and ketones, nonionic surfactants, anionic surfactants, cationic surfactants, antifoaming agents and so on may further be added in their respective proper amounts. Those additives are added for not only betterment of resist characteristics but also other purposes of, e.g., elevating the adhesiveness to a substrate, reducing the amount of a developer used and lessening the defects arising from air bubbles at the time of development.

Now, the present invention will be illustrated in greater detail by reference to the following examples, which are not to be considered as limiting on or determinative of the scope of this invention.

SYNTHESIS EXAMPLE 1

Synthesis of Polymer A

The hydride of ring-opening polymerization product of the norbornene derivative disclosed in Example 4 of JP-A-9-244247 (having the constitutional repeating unit illustrated below) was synthesized in accordance with the method disclosed in European Patent No. 0,789,278 (weight-average molecular weight: 22,000).

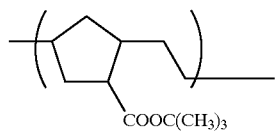

SYNTHESIS EXAMPLE 2

Synthesis of Polymer B

The hydride of ring-opening polymerization product of the norbornene derivative disclosed in Example 1 of JP-A-9-244247 (having the constitutional repeating unit illustrated below) was synthesized in accordance with the method disclosed in European Patent No. 0,789,278 (weight-average molecular weight: 17,000).

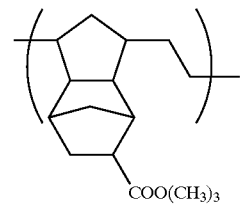

SYNTHESIS EXAMPLE 3

Synthesis of Polymer C

The copolymer of norbornene, maleic anhydride, t-butylacrylate and acrylic acid (having the following constitutional repeating units) was synthesized in accordance with the method disclosed in Example 7 of JP-A-10-10739 (weight-average molecular weight: 17,000; ratio between the repeating units: 50/25/25 by mole).

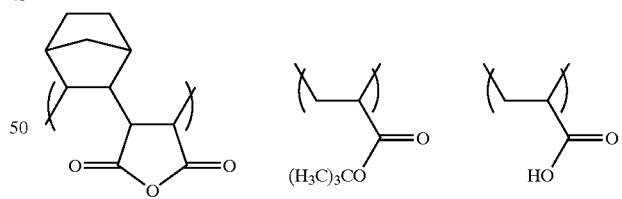

SYNTHESIS EXAMPLE 4

Synthesis of Polymer D

The copolymer of adamantyl methacrylate and t-butylacrylate (having the following constitutional repeating units) was synthesized in accordance with the method disclosed in Example 1 of JP-A-7-234511 (weight-average molecular weight: 5,000; ratio between the repeating units: 58/42 by mole).

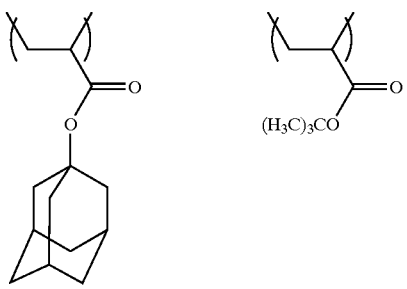

SYNTHESIS EXAMPLE 5

Synthesis of Acid-decomposable Low Molecular Compound (Compound a)

The mixture of 122.7 g (0.3 mole) of cholic acid and 120 ml of thionyl chloride was refluxed for 1 hour. After removal of excess thionyl chloride, the solid obtained was dissolved in 150 ml of tetrahydrofuran. Thereto, 40 g (0.35 mole) of potassium-t-butoxide was added little by little. The resulting mixture was refluxed for 6 hours, and then cooled. The reaction mixture thus prepared was poured into water to deposit a solid matter. The solid matter was filtered off, washed with water, and then dried under reduced pressure. Thus obtained crude product was recrystallized from n-hexane to give t-butyl cholate (having the following structural formula) in a 70% yield.

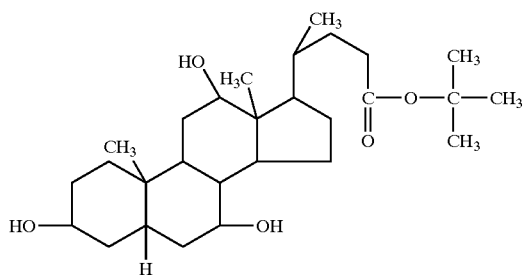

SYNTHESIS EXAMPLE 6

Synthesis of Polymer E

Polymer E was synthesized according to Synthesis Example 1 of JP-A-6-308734. More specifically, 30 g of poly(hydroxystyrene) was dissolved in tetrahydrofuran, and admixed with 10 g of potassium t-butoxide. Thereto, 60 g of di-t-butyl dicarbonate was further added dropwise at 0° C. with stirring, and therein the reaction was run for 4 hours. At the conclusion of the reaction, the reaction solution was dripped into water, thereby precipitating a resinous matter. The resinous matter was put in a vacuum desiccator and dried at 50° C. for one night. The resin obtained (Polymer E) had Mw of 15,000. As for the structure thereof, it was confirmed by the NMR measurement that 29% of the hydrogen atoms of the phenolic hydroxy groups were replaced by t-butoxycarbonyl groups.

EXAMPLES 1a TO 6a AND COMPARATIVE EXAMPLES 1a TO 5a

Preparation of Photosensitive Resin Compositions

The ingredients set forth in Table 1, namely the Polymer A, B, C or D synthesized in Synthesis Example 1, 2, 3 or 4 respectively, triphenylsulfonium triflate (PAG-1) as a photo-acid generator, the compound synthesized in Synthesis Example 5 (Compound a) as an acid-decomposable low molecular compound, a nitrogen-containing basic compound, a surfactant, and propylene glycol monomethyl ether acetate as a solvent, were mixed together. The dotted line mark in Table 1 means that the corresponding ingredient was not used.

After mixing the foregoing ingredients together, the mixture obtained was subjected to filtration with a 0.1 µm Teflon filter, thereby preparing each photosensitive resin composition.

The following are the amounts of ingredients used:

| | |
|---|---|
| Polymer A, B, C or D | 10 g |
| Photo-acid generator | 0.06 g |
| Acid-decomposable low molecular compound | 0.25 g |
| Nitrogen-containing basic compound | 0.04 g |
| Surfactant | 0.05 g |
| Solvent | 57.4 g |

The thus prepared photosensitive resin compositions were each examined for number of development defects and resist image quality in accordance with the following evaluation methods respectively. The evaluation results of the development defects are shown in Table 2, and those of image quality are shown in Table 3.

Evaluation of Development Defects (1) Development Defects I

Each photosensitive resin composition was coated uniformly on a hexamethyldisilazane-treated silicon substrate by means of a spin coater, and dried by 90-second heating on a 120° C. hot plate to be formed into a 0.50 µm-thick resist film. This resist film was exposed to ArF excimer laser beams via a mask. Immediately after the exposure, the resist film was heated for 90 seconds on a 110° C. hot plate. Then, it was developed with a 2.38% by weight aqueous solution of tetramethylammonium hydroxide for 60 seconds at 23° C., rinsed with pure water for 30 seconds, and then dried. Thus, contact hole patterns were formed on each resist film, and the number of development defects generated therein was counted (under the condition of threshold 12 and pixcel size of 0.39) with a KAL 2112 machine (produced by KAL Tenkohl Inc.).

(2) Development Defects II

The number of development defects was examined by the same method as adopted for the examination of the foregoing development defects I, except that each resist film underwent no exposure.

Evaluation of Image Quality

Each photosensitive resin composition was formed into a 0.50 µm-thick resist film, and further subjected sequentially to exposure, heating, development, rinsing and drying steps under the same conditions as in the case of evaluating the development defects I mentioned above. Each of the thus processed resist films was examined for thickness by means of a film thickness gauge, and thereby the residual film rate [(film thickness after processing/film thickness before processing)×100] was determined.

Further, the pattern profile was examined by observing the 0.25 µm line patterns formed on each resist film under a scanning electron microscope. In Table 3, the letter A is used for symbolizing a rectangular profile, and the letter B for symbolizing another profile.

TABLE 1

Formulation of Positive Photosensitive Resin Composition

|  | Polymer | Photo-acid Generator | Acid-Decomposable Low Molecular Compound | Nitrogen-Containing Basic Compound | Surfactant | Solvent |
|---|---|---|---|---|---|---|
| Example 1a | A | PAG-1 | — | N-1 | W-1 | S-1 |
| Example 2a | B | PAG-1 | — | N-2 | W-1 | S-1 |
| Example 3a | C | PAG-1 | — | N-3 | W-1 | S-1 |
| Example 4a | D | PAG-1 | — | N-4 | W-2 | S-1 |
| Example 5a | B | PAG-1 | Compound a | N-1 | W-2 | S-1 |
| Example 6a | C | PAG-1 | Compound a | N-2 | W-3 | S-1 |
| Compar. Ex. 1a | A | PAG-1 | — | — | — | S-1 |
| Compar. Ex. 2a | B | PAG-1 | — | — | W-1 | S-1 |
| Compar. Ex. 3a | C | PAG-1 | — | N-3 | — | S-1 |
| Compar. Ex. 4a | D | PAG-1 | — | N-4 | W-4 | S-1 |
| Compar. Ex. 5a | B | PAG-1 | Compound a | — | — | S-1 |

The symbols in Table 1 stand for the following compounds respectively;

PAG-1: triphenylsulfonium triflate
N-1: Hexamethylenetetramine
N-2: 1,5-Diazabicyclo[4.3.0]-5-nonene
N-3: 1,8-Diazabicyclo[5.4.0]-7-undecene
N-4: 1,4-Diazabicyclo[2.2.2]octane
W-1: Megafac F176 (produced by Dai-Nippon Ink & Chemicals Inc.) (fluorine-containing surfactant)
W-2: Megafac R08 (produced by Dai-Nippon Ink & Chemicals Inc.) (fluorine and silicon-containing surfactant)
W-3: Polysiloxane polymer KP-341 (produced by Shin-etsu Chemical Industry Co., Ltd.)
W-4: Polyoxyethylene nonyl phenyl ether
S-1: Propylene glycol monomethyl ether acetate

TABLE 2

Number of Development Defects

|  | Development Defects I | Development Defects II |
|---|---|---|
| Example 1a | 4 | 11 |
| Example 2a | 2 | 5 |
| Example 3a | 5 | 15 |
| Example 4a | 4 | 7 |
| Example 5a | 0 | 2 |
| Example 6a | 0 | 1 |
| Comparative Example 1a | 62 | 340 |
| Comparative Example 2a | 36 | 130 |
| Comparative Example 3a | 42 | 165 |
| Comparative Example 4a | 3 | 8 |
| Comparative Example 5a | 23 | 35 |

TABLE 3

Image Quality of Resist

|  | Residual Film Rate (%) | Profile |
|---|---|---|
| Example 1a | 99.9 | A |
| Example 2a | 99.7 | A |
| Example 3a | 99.4 | A |
| Example 4a | 99.2 | A |
| Example 5a | 100.0 | A |
| Example 6a | 100.0 | A |
| Comparative Example 1a | 99.2 | A |
| Comparative Example 2a | 99.0 | A |
| Comparative Example 3a | 99.0 | A |
| Comparative Example 4a | 94.2 | B |
| Comparative Example 5a | 99.2 | A |

As can be seen from the results shown in Tables 2 and 3, all the photosensitive resin compositions according to the present invention produced very few development defects and formed patterns having a rectangular profile.

On the other hand, a lot of development defects were developed in the cases of Comparative Examples 1 and 5 using neither nitrogen-containing basic compound (C) nor surfactant (D), Comparative Example 2 using a surfactant (D) but no nitrogen-containing basic compound (C) and Comparative Example 3 using a nitrogen-containing basic compound (C) but no surfactant (D). In the case of Comparative Example 4 using a surfactant other than the surfactants specified by the present invention, the development defects were relatively few but the resist profile was not good.

EXAMPLES 7a TO 14a AND COMPARATIVE EXAMPLES 6a TO 7a

Preparation of Photosensitive Resin Compositions

The ingredients set forth in Table 4, namely the Polymer B, C or D synthesized in Synthesis Example 2, 3 or 4 respectively, (PAG-1) recited above or triphenylsulfonium perfluorobutanesulfonate (PAG-2) as a photo-acid generator, the compound synthesized in Synthesis Example 5 as an acid-decomposable low molecular compound and a combination of nitrogen-containing basic compound, surfactant and solvent set forth in Table 4, were mixed in their respective proportions set forth in Table 4. The dotted line mark in Table 4 means that the corresponding ingredient was not used.

After the foregoing ingredients were mixed together, the mixture obtained was subjected to filtration with a 0.1 μm Teflon filter, thereby preparing each photosensitive resin composition. In Table 5, the ratio of Component (B) to Component (C) ((B)/(C) ratio) and the ratio of Component (A) to Component (D) ((A)/(D) ratio) in each photosensitive resin composition are set forth.

TABLE 4

Formulation of Positive Photosensitive Resin Composition

| | Polymer (A) | Photo-acid Generator (B) | Acid-decomposable Compound (C) | | Nitrogen-containing Basic Compound (D) | | Surfactant (E) | | Solvent (F) | |
|---|---|---|---|---|---|---|---|---|---|---|
| Example 7a | B | 14.69 PAG-2 | 0.300 | — | — | N-3 | 0.005 | W-1 | 0.001 | S-1 | 85.00 |
| Example 8a | B | 13.34 PAG-1 | 0.150 | Compound a | 1.50 | N-2 | 0.008 | W-1 | 0.001 | S-3 | 86.49 |
| Example 9a | C | 14.84 PAG-1 | 0.150 | — | — | N-2 | 0.008 | W-2 | 0.009 | S-5/ S-6 | 72.24/ 12.74 |
| Example 10a | D | 13.84 PAG-2 | 0.150 | Compound a | 1.00 | N-4 | 0.001 | W-3 | 0.020 | S-1/ S-2 | 59.50/ 25.50 |
| Example 11a | C | 14.55 PAG-2 | 0.450 | — | — | N-2 | 0.003 | W-1 | 0.001 | S-3/ S-4 | 59.50/ 25.50 |
| Comparative Example 6a | C | 14.42 PAG-1 | 0.087 | — | — | N-3 | 0.057 | — | — | S-1 | 85.44 |
| Comparative Example 7a | D | 14.83 PAG-1 | 0.150 | — | — | N-4 | 0.008 | W-4 | 0.015 | S-3 | 85.00 |
| Example 12a | C | 14.42 PAG-1 | 0.087 | — | — | N-3 | 0.057 | W-1 | 0.072 | S-1 | 85.36 |
| Example 13a | B | 13.27 PAG-2 | 0.150 | Compound a | 1.50 | N-2 | 0.008 | W-3 | 0.075 | S-3 | 85.00 |
| Example 14a | D | 14.25 PAG-1 | 0.750 | — | — | N-2 | 0.002 | W-3 | 0.001 | S-1 | 85.00 |

The symbols PAG-1, N-2, N-3, N-4, W-1, W-2, W-3, W-4 and S-1 stand for the same compounds set forth in Table 1 respectively, and the other symbols stand for the following compounds respectively;
PAG-2: Triphenylsulfonium perfluorobutanesulfonate
S-2: Propylene glycol monomethyl ether
S-3: Ethyl lactate
S-4: Ethyl 3-ethoxypropionate
S-5: Propylene glycol monopropyl ether propionate
S-6: 2-Heptanone

TABLE 5

Component Ratios in Photosensitive Resin Composition

| | (B)/(C) ratio | (A)/(D) ratio |
|---|---|---|
| Example 7a | 60.0 | 14690 |
| Example 8a | 18.8 | 13340 |
| Example 9a | 18.8 | 1649 |
| Example 10a | 150.0 | 692 |
| Example 11a | 150.0 | 14550 |
| Comparative Example 6a | 1.5 | — |
| Comparative Example 7a | 18.8 | 989 |
| Example 12a | 1.5 | 200 |
| Example 13a | 18.8 | 177 |
| Example 14a | 375.0 | 14250 |

The thus prepared photosensitive resin compositions were each examined for number of development defects and resist image quality in accordance with the following evaluation methods respectively. The evaluation results of the development defects are shown in Table 6, and those of image quality are shown in Table 7.

Evaluation of Development Defects

The evaluation of development defects was carried out by the same method as mentioned in Examples 1a–6a.

Evaluation of Image Quality

On a hexamethyldisilazane-treated silicon substrate, DUV-42 (produced by Brewer Science Inc.) was coated uniformly in a thickness of 600 Å with a spin coater, dried for 90 seconds on a 100° C. hot plate, and further heated for 240 seconds at 190° C., thereby forming a reflection inhibitive film. On this reflection inhibitive film, each photosensitive resin composition was coated with a spin coater and dried for 90 seconds at 130° C. to be formed into a 0.50 µm-thick resist film. Further, this resist film was exposed to ArF excimer laser beams via a mask. Immediately after the exposure, the resist film was heated for 90 seconds on a 130° C. hot plate. Then, it was developed with an aqueous solution of tetramethylammonium hydroxide for 60 seconds at 23° C., rinsed with pure water for 30 seconds, and then dried. Thus, line patterns were formed on each resist film. Thereafter, each of the thus processed resist films was examined for thickness by means of a film thickness gauge, and the residual film rate was determined by substituting this thickness value in the equation mentioned hereinbefore.

Further, the pattern profile was examined by observing the 0.25 µm line patterns formed on each resist film under a scanning electron microscope. In Table 7, the letter A is used for symbolizing a rectangular profile, the letter C for symbolizing a tapered profile, and the letter B for a profile with a T shape.

The sensitivity was expressed in terms of the exposure amount required for reproducing the 0.25 µm mask patterns.

The resolution was represented by the threshold resolution achieved under the exposure amount enabling the reproduction of the 0.25 µm mask patterns.

With respect to the developability, the letter A is used for symbolizing the case where no development residues was observed, and the letter B for symbolizing the case where development residues were more or less observed.

TABLE 6

Number of Development Defects

| | Development Defects I | Development Defects II |
|---|---|---|
| Example 7a | 0 | 1 |
| Example 8a | 0 | 0 |
| Example 9a | 0 | 1 |
| Example 10a | 0 | 0 |
| Example 11a | 1 | 0 |
| Comparative Example 6a | 42 | 165 |
| Comparative Example 7a | 4 | 9 |
| Example 12a | 5 | 7 |
| Example 13a | 1 | 2 |
| Example 14a | 6 | 7 |

TABLE 7

Image Quality of Resist

| | Residual Film Rate (%) | Sensitivity (mJ/cm$^2$) | Resolution ($\mu$m) | Profile | Developability |
|---|---|---|---|---|---|
| Example 7a | 99.9 | 21 | 0.14 | A | A |
| Example 8a | 100.0 | 20 | 0.14 | A | A |
| Example 9a | 99.9 | 28 | 0.16 | A | A |
| Example 10a | 100.0 | 17 | 0.14 | A | A |
| Example 11a | 99.9 | 15 | 0.15 | A | A |
| Compar. Ex. 6a | 99.0 | 64 | 0.17 | A | A |
| Compar. Ex. 7a | 94.3 | 36 | 0.18 | C | A |
| Example 12a | 99.4 | 59 | 0.17 | A | B |
| Example 13a | 100.0 | 20 | 0.18 | A | B |
| Example 14a | 98.2 | 16 | 0.20 | B | A |

As can be seen from the results shown in Tables 6 and 7, the present compositions wherein the particular components were used within the special proportion ranges provided resist films causing very few development defects, forming patterns with a rectangular profile and having excellent sensitivity, resolution and developability.

In accordance with embodiments of the present invention, the positive photosensitive resin compositions cause very few development defects, showed satisfactorily high sensitivity, resolution and developability and ensure excellent pattern profiles when ArF excimer laser beams are used as exposure light source. Therefore, they are effective in forming fine patterns meeting the requirements for the production of semiconductor elements.

EXAMPLES 1b TO 7b AND COMPARATIVE EXAMPLES 1b To 7b

Preparation of Photosensitive Resin Compositions

The ingredients set forth in Table 8, namely the Polymer A, B, C, D or E synthesized in Synthesis Example 1, 2, 3, 4 or 6 respectively, triphenylsulfonium triflate (PAG-1) as a photo-acid generator, the compound synthesized in Synthesis Example 5 (Compound a) as an acid-decomposable low molecular compound and a combination of nitrogen-containing basic compound, surfactant and solvents set forth in Table 8, were mixed together. The dotted line mark in Table 8 means that the corresponding ingredient was not used.

After mixing the foregoing ingredients together, the mixture obtained was subjected to filtration with a 0.1 $\mu$m Teflon filter, thereby preparing each photosensitive resin composition.

The following are the amounts of ingredients used:

| | |
|---|---|
| Polymer A, B, C, D or E | 10 g |
| Photo-acid generator | 0.06 g |
| Acid-decomposable low molecular compound | 0.25 g |
| Nitrogen-containing basic compound | 0.04 g |
| Surfactant | 0.05 g |
| Solvents | 57.4 g |

The thus prepared photosensitive resin compositions were each examined for numbers of development defects I and II in accordance with the foregoing evaluation methods respectively. The evaluation results are shown in Table 9.

TABLE 8

Formula of Positive Photosensitive Resin Composition

| | Polymer | Photo-acid generator | Acid-decomposable low molecular compound | Nitrogen containing basic compound | Surfactant | Solvents (ratio by weight) |
|---|---|---|---|---|---|---|
| Example 1b | A | PAG-1 | — | N-1 | W-1 | S-2/S-3 (70/30) |
| Example 2b | B | PAG-1 | — | N-2 | W-1 | S-2/S-3 (80/20) |
| Example 3b | C | PAG-1 | — | N-3 | W-2 | S-2/S-3/S-4 (75/20/5) |
| Example 4b | D | PAG-1 | Compound a | N-4 | W-3 | S-2/S-3/S-5 (75/20/5) |
| Example 5b | A | PAG-1 | Compound a | N-3 | W-2 | S-2/S-3/S-6 (82/15/3) |
| Example 6b | B | PAG-1 | — | N-3 | W-3 | S-1/S-3/S-6 (65/35/5) |
| Example 7b | C | PAG-1 | Compound a | N-1 | W-1 | S-2/S-3/S-6 (60/30/10) |
| Compar. Ex. 1b | A | PAG-1 | — | — | — | S-2/S-3 (70/30) |
| Compar. Ex. 2b | B | PAG-1 | — | — | W-1 | S-1/S-3 (80/20) |
| Compar. Ex. 3b | A | PAG-1 | — | N-1 | — | S-2/S-3 (70/30) |
| Compar. Ex. 4b | A | PAG-1 | — | N-1 | W-3 | S-2 |
| Compar. Ex. 5b | C | PAG-1 | — | N-3 | W-4 | S-2/S-3 (70/30) |
| Compar. Ex. 6b | E | PAG-1 | — | — | — | S-2/S-3 (50/50) |
| Compar. Ex. 7b | E | PAG-1 | — | — | W-1 | S-2 |

The symbols used in Table 8 stand for the following compounds respectively;
S-2: Ethyl lactate
S-3: butyl acetate
S-4: γ-Butyrolactone
S-5: Propylene carbonate
S-6: Ethylene carbonate The other symbols stand for the same compounds as defined in the preceding Examples, respectively.

TABLE 9

Number of Development Defects

| | Development Defects I | Development Defects II |
|---|---|---|
| Example 1b | 3 | 3 |
| Example 2b | 3 | 4 |
| Example 3b | 1 | 2 |
| Example 4b | 0 | 0 |
| Example 5b | 0 | 0 |
| Example 6b | 1 | 0 |
| Example 7b | 0 | 0 |
| Compar. Ex. 1b | 68 | 362 |
| Compar. Ex. 2b | 43 | 165 |
| Compar. Ex. 3b | 35 | 76 |
| Compar. Ex. 4b | 11 | 7 |
| Compar. Ex. 5b | 7 | 17 |
| Compar. Ex. 6b | 24 | 38 |
| Compar. Ex. 7b | 17 | 14 |

As can be seen from the results shown in Table 9, the number of each type of development defects was very small in every case of the present photosensitive resin compositions. In particular, the results were entirely satisfactory in the cases of the compositions using the third solvent (c) (Examples 3b–7b).

In the cases of comparative photosensitive resin compositions, on the other hand, the development defects were considerably large in number. In particular, the number of development defects roughly doubled in the case of Comparative Example 4b using ethyl lactate alone as the solvent, compared with the present cases of using mixed solvent systems. In the case of Comparative Example 5b using a surfactant other than those specified by the present invention, the number of development defects was more than twice those in the present cases of using the same mixed solvent system.

EXAMPLES 1c TO 7c AND COMPARATIVE EXAMPLES 1c TO 7c

Preparation of Photosensitive Resin Compositions

The ingredients set forth in Table 10, namely the Polymer A, B, C, D or E synthesized in Synthesis Example 1, 2, 3, 4 or 6 respectively, triphenylsulfonium triflate (PAG-1) as a photo-acid generator, the compound synthesized in Synthesis Example 5 (Compound a) as an acid-decomposable low molecular compound and a combination of nitrogen-containing basic compound, surfactant and solvents set forth in Table 10, were mixed together. The dotted line mark in Table 10 means that the corresponding ingredient was not used.

After mixing the foregoing ingredients together, the mixture obtained was subjected to filtration with a 0.1 μm Teflon filter, thereby preparing each photosensitive resin composition.

The following are the amounts of ingredients used:

| | |
|---|---|
| Polymer A, B, C, D or E | 10 g |
| Photo-acid generator | 0.06 g |
| Acid-decomposable low molecular compound | 0.25 g |
| Nitrogen-containing basic compound | 0.04 g |
| Surfactant | 0.05 g |
| Solvents | 57.4 g |

The thus prepared photosensitive resin compositions were each examined for numbers of development defects I and II in accordance with the foregoing evaluation methods respectively. The evaluation results are shown in Table 11.

TABLE 10

(Formulation of Positive Photosensitive Resin Composition)

| | Polymer | Photo-acid generator | Acid-decomposable low molecular compound | Nitrogen containing basic compound | Surfactant | Solvents (ratio by weight) |
|---|---|---|---|---|---|---|
| Example 1c | A | PAG-1 | — | N-1 | W-1 | S-2/S-7 (70/30) |
| Example 2c | B | PAG-1 | — | N-2 | W-1 | S-2/S-7 (80/20) |
| Example 3c | C | PAG-1 | — | N-3 | W-2 | S-2/S-7/S-4 (75/20/5) |
| Example 4c | D | PAG-1 | Compound a | N-4 | W-3 | S-2/S-7/S-5 (75/20/5) |
| Example 5c | A | PAG-1 | Compound a | N-3 | W-2 | S-2/S-7/S-6 (82/15/3) |
| Example 6c | B | PAG-1 | — | N-3 | W-3 | S-2/S-7/S-6 (65/35/5) |
| Example 7c | C | PAG-1 | Compound a | N-1 | W-1 | S-2/S-7/S-6 (60/30/10) |
| Compar. Ex. 1c | A | PAG-1 | — | — | — | S-2/S-7 (70/30) |
| Compar. Ex. 2c | B | PAG-1 | — | — | W-1 | S-2/S-7 (80/20) |
| Compar. Ex. 3c | A | PAG-1 | — | N-1 | — | S-2/S-7 (70/30) |
| Compar. Ex. 4c | A | PAG-1 | — | N-1 | W-3 | S-2 |
| Compar. Ex. 5c | C | PAG-1 | — | N-3 | W-4 | S-2/S-7 (70/30) |
| Compar. Ex. 6c | E | PAG-1 | — | — | — | S-2/S-7 (50/50) |
| Compar. Ex. 7c | E | PAG-1 | — | — | W-1 | S-2 |

The symbols used in Table 10 stand for the following compounds respectively;
S-2: Ethyl lactate
S-7: Ethyl 3-ethoxypropionate
S-4: γ-Butyrolactone
S-5: Propylene carbonate
S-6: Ethylene carbonate The other symbols stand for the same compounds as defined in the preceding Examples, respectively.

TABLE 11

Number of Development Defects

| | Development Defects I | Development Defects II |
|---|---|---|
| Example 1c | 2 | 3 |
| Example 2c | 3 | 3 |
| Example 3c | 1 | 1 |
| Example 4c | 0 | 0 |
| Example 5c | 0 | 0 |
| Example 6c | 1 | 0 |
| Example 7c | 0 | 0 |
| Compar. Ex. 1c | 60 | 327 |
| Compar. Ex. 2c | 33 | 145 |
| Compar. Ex. 3c | 35 | 83 |
| Compar. Ex. 4c | 11 | 7 |
| Compar. Ex. 5c | 5 | 10 |
| Compar. Ex. 6c | 21 | 28 |
| Compar. Ex. 7c | 17 | 14 |

As can be seen from the results shown in Table 11, the number of each type of development defects was very small in every case of the present photosensitive resin compositions. In particular, there were no or very few, if any, development defects in the cases of Examples 3c–7c using three kinds of solvents.

In the cases of comparative photosensitive resin compositions, on the other hand, the development defects were markedly large in number. In particular, the number of development defects in the case of Comparative Example 4c using ethyl lactate alone as the solvent was more than twice that in the case of Example 1c.

In the case of Comparative Example 5c using a surfactant other than those specified by the present invention, the number of development defects roughly doubled, compared with the case of Example 1c.

The positive photosensitive resin compositions according to the present invention have excellent resist characteristics, coating suitability, storage stability and safety. In particular, they have an advantage of being free of the development-defects problem. Therefore, the present positive photosensitive resin compositions are especially useful for the lithography utilizing ArF excimer laser beams as exposure light source.

While the invention has been described in detail and with reference to specific embodiments thereof, it will be apparent to one skilled in the art that various changes and modifications can be made therein without departing from the spirit and scope thereof.

What is claimed is:

1. A positive photosensitive resin composition comprising:

(A) a polymer which has alicyclic hydrocarbon skeletons and decomposes by the action of an acid to thereby become alkali-soluble, (B) a compound which generates an acid upon irradiation with actinic rays, (C) a nitrogen-containing basic compound, and (D) at least one of a silicon-containing surfactant and a surfactant containing both fluorine and silicon atoms.

2. The positive photosensitive resin composition as described in claim 1, further comprising a low molecular acid-decomposable compound which has a molecular weight of 2,000 or below and a group capable of decomposing under the action of an acid to increase its solubility in alkali.

3. The positive photosensitive resin composition as described in claim 2, wherein the content of the low molecular acid-decomposable compound is from 0.5 to 20.0 parts by weight per 100 parts by weight of the total solids of the composition.

4. The positive photosensitive resin composition as described in claim 1, wherein the compound as Component (B) is an onium salt.

5. The positive photosensitive resin composition as described in claim 1, wherein the nitrogen-containing basic compound as Component (C) is an organic amine.

6. The positive photosensitive resin composition as described in claim 1, wherein the actinic rays are deep ultraviolet rays having wavelengths of 220 nm or shorter.

7. The positive photosensitive resin composition as in claim 1, further comprising a fluorine-containing surfactant.

8. The positive photosensitive resin composition as in claim 1, wherein said polymer which has alicyclic hydrocarbon skeletons and decomposes under the action of an acid to become alkali soluble contains a repeating unit selected from the group consisting of repeating units having the structural formulas (b-1) to (b-8);

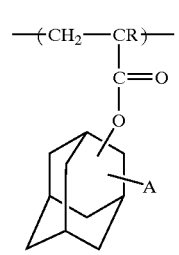
(b-1)

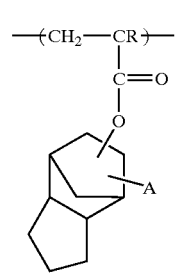
(b-2)

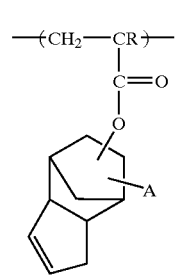
(b-3)

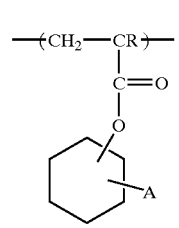
(b-4)

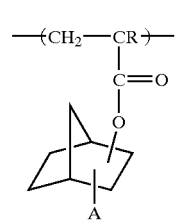
(b-5)

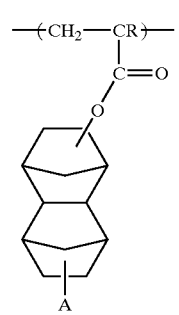
(b-6)

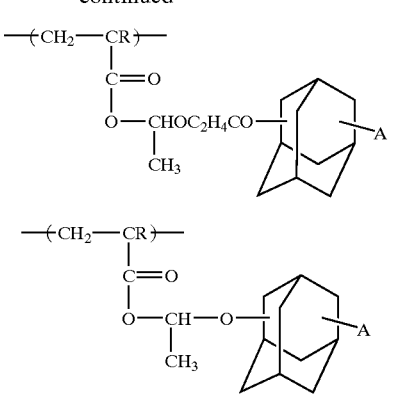

wherein A is selected from the group consisting of hydrogen, hydroxyl, a carboxyl group, an alkoxycarbonyl group, a substituted or unsubstituted alkyl group having from 1 to 10 carbon atoms, a substitued or unsubstituted alkoxy group having from 1 to 10 carbon atoms, and a substituted or unsubstituted alkenyl group having from 1 to 10 atoms, and R is selected from the group consisting of hydrogen and a substituted or unsubstituted alkyl group having from 1 to 3 carbon atoms.

9. A positive photosensitive resin composition comprising:
 (A) a polymer which has alicyclic hydrocarbon skeletons and decomposes under the action of an acid to thereby become alkali-soluble,
 (B) a compound which generates an acid upon irradiation with actinic rays,
 (C) a nitrogen-containing basic compound,
 (D) at least one of a silicon-containing surfactant and a surfactant containing both fluorine and silicon atoms, and
 (E) a solvent comprising as a first solvent at least one solvent selected from the following group (a) in an amount of from 60 to 90% by weight based on the total solvent and as a second solvent a solvent selected from the following group (b) in an amount of from 10 to 40% by weight to the total solvent; the group (a) consisting of ethyl lactate, propylene glycol monomethyl ether acetate, propylene glycol monomethyl ether propionate, methyl 3-methoxypropionate and ethyl 3-ethoxypropionate, and the group (b) consisting of solvents having a viscosity of not higher than 1 centipoise at 20° C.

10. The positive photosensitive resin composition as described in claim 9, wherein the solvent as Component (E) further comprises as a third solvent (c) a solvent having a boiling point of not lower than 180° C. and a solubility parameter of at least 12 in an amount of 1 to 20% by weight based on the total solvent.

11. The positive photosensitive resin composition as described in claim 10, wherein the third solvent (c) is at least one solvent selected from the group consisting of γ-butyrolactone, ethylene carbonate and propylene carbonate.

12. The positive photosensitive resin composition as described in claim 9, wherein the number of carbon atoms forming each of the alicyclic hydrocarbon skeletons present in the polymer as Component (A) is from 5 to 25.

13. The positive photosensitive resin composition as described in claim 9, wherein the nitrogen-containing basic compound as Component (C) is at least one compound selected from the group consisting of organic amines, basic ammonium salts and basic sulfonium salts.

14. The positive photosensitive resin composition as described in claim 9, further comprising a low molecular acid-decomposable dissolution inhibitive compound which has a molecular weight of 2,000 or below and a group capable of decomposing under the action of an acid to increase its solubility in alkali.

15. The positive photosensitive resin composition as described in claim 9, wherein the actinic rays are deep ultraviolet rays having wavelengths of 220 nm or shorter.

16. The positive photosensitive resin composition as in claim 9, further comprising a fluorine-containing surfactant.

17. The positive photosensitive resin composition as in claim 9, wherein said polymer which has alicyclic hydrocarbon skeletons and decomposes under the action of an acid to become alkali soluble contains a repeating unit selected from the group consisting of repeating units having the structural formulas (b-1) to (b-8);

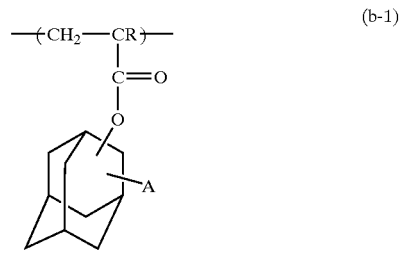

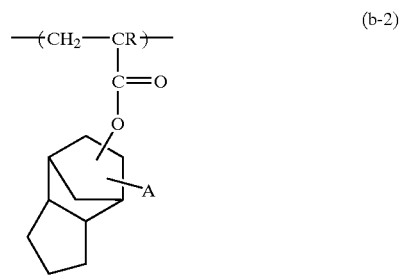

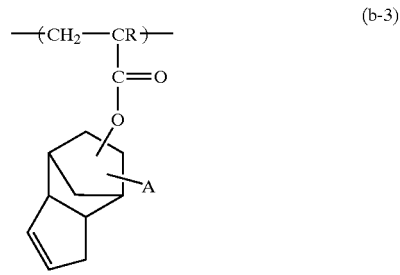

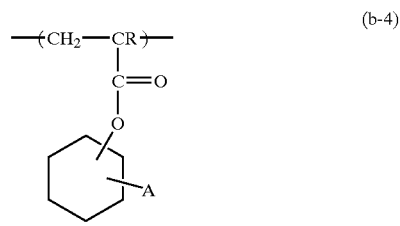

-continued (b-5)
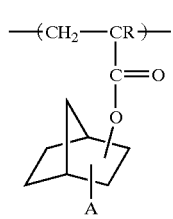

(b-6)
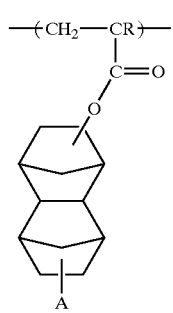

(b-7)
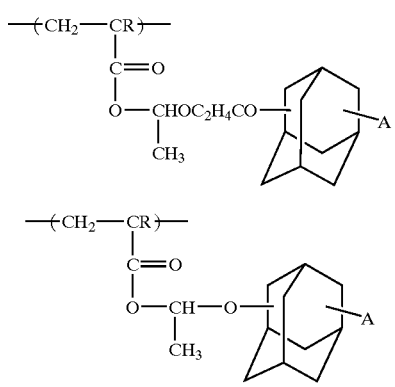

(b-8)
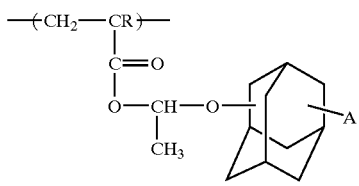

wherein A is selected from the group consisting of hydrogen, hydroxyl, a carboxyl group, an alkoxycarbonyl group, a substituted or unsubstituted alkyl group having from 1 to 10 carbon atoms, a substituted or unsubstituted alkoxy group having from 1 to 10 carbon atoms, and a substituted or unsubstituted alkenyl group having from 1 to 10 carbon atoms, and R is selected from the group consisting of hydrogen and a substituted or unsubstituted alkyl group having from 1 to 3 carbon atoms.

18. A positive photosensitive resin composition comprising:
  (A) a polymer which has bridged alicyclic hydrocarbon skeletons and decomposes by the action of an acid to thereby become alkali-soluble,
  (B) a compound which generates an acid upon irradiation with actinic rays,
  (C) a nitrogen-containing basic compound,
  (D) at least one of a silicon-containing surfactant and a surfactant containing both fluorine and silicon atoms, and
  (E) a solvent;
wherein the ratio of (B) to (C) by weight is from 5 to 300 and the ratio of (A) to (D) by weight is from 500 to 20,000.

19. The positive photosensitive resin composition as described in claim 18, wherein the solvent as Component (E) comprises at least one solvent selected from the group consisting of ethyl lactate, propylene glycol monomethyl ether acetate, propylene glycol monomethyl ether, propylene glycol monomethyl ether propionate, methyl 3-methoxypropionate, ethyl 3-ethoxypripionate and 2-heptanone in an amount of at Least 70% by weight based on the total solvent.

20. The positive photosensitive resin composition as in claim 18, further comprising a fluorine-containing surfactant.

21. The positive photosensitive resin composition as in claim 18, wherein said polymer which has alicyclic hydrocarbon skeletons and decomposes under the action of an acid to become alkali soluble containing a repeating unit selected from the group consisting of repeating units having the structural formulas (b-1) to (b-8):

(b-1)
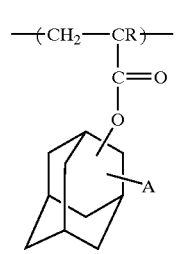

(b-2)
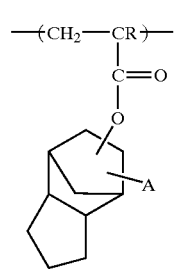

(b-3)
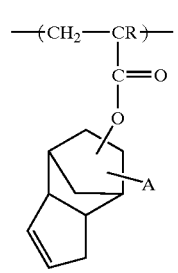

(b-4)
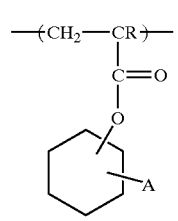

(b-5)
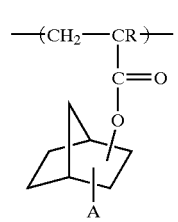

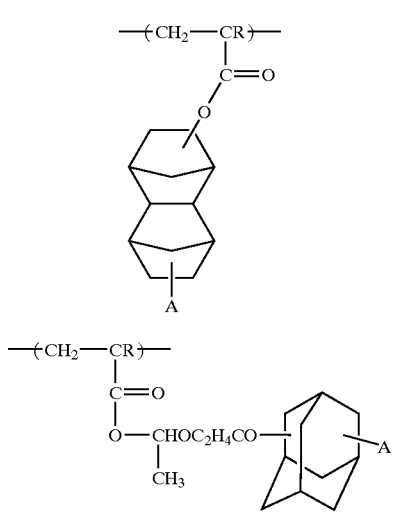

(b-6)

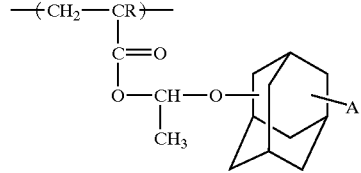

(b-8)

(b-7)

wherein A is selected from the group consisting of hydrogen, hydroxyl, a carboxyl group, an alkoxycarbonyl group, a substituted or unsubstituted alkyl group having from 1 to 10 carbon atoms, a substituted or unsubstituted alkoxy group having from 1 to 10 carbon atoms, and a substituted or unsubstituted alkenyl group having from 1 to 10 carbon atoms, and R is selected from the group consisting of hydrogen and a substituted or unsubstituted alkyl group having from 1 to 3 carbon atoms.

* * * * *